(12) United States Patent
Whitmore et al.

(10) Patent No.: US 10,208,902 B2
(45) Date of Patent: *Feb. 19, 2019

(54) LIGHT SOURCE ASSEMBLY WITH MULTIPLE, DISPARATE LIGHT SOURCES

(71) Applicant: Daylight Solutions, Inc., San Diego, CA (US)

(72) Inventors: Alexander Jason Whitmore, San Diego, CA (US); Ronald Kevin Arp, Ramona, CA (US); Kristen Diane Cecchetti, Poway, CA (US); Michael Vernon Henson, San Diego, CA (US); Eric Kim, San Diego, CA (US); J. Allen Priest, Escondido, CA (US); Michael Pushkarsky, San Diego, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/783,928

(22) Filed: Oct. 13, 2017

(65) Prior Publication Data

US 2018/0038561 A1 Feb. 8, 2018

Related U.S. Application Data

(63) Continuation-in-part of application No. 14/522,290, filed on Oct. 23, 2014, now Pat. No. 9,791,113.
(Continued)

(51) Int. Cl.
*F21L 4/02* (2006.01)
*H01S 5/024* (2006.01)
(Continued)

(52) U.S. Cl.
CPC ............ *F21L 4/02* (2013.01); *F21L 4/022* (2013.01); *F21V 23/003* (2013.01);
(Continued)

(58) Field of Classification Search
CPC ...... F21L 4/022; H01S 5/3401; H01S 5/4087; F21V 23/008
See application file for complete search history.

(56) References Cited

U.S. PATENT DOCUMENTS 6,134,257 A  10/2000 Capasso et al.
6,400,744 B1  6/2002 Capasso et al.
(Continued)

*Primary Examiner* — Dung Nguyen
(74) *Attorney, Agent, or Firm* — Roeder & Broder LLP; Steven G. Roeder

(57) ABSTRACT

A light source assembly includes a housing assembly and at least two sets of disparate light sources that are coupled to the housing assembly. The sets of disparate light sources include a first plurality of disparate light sources; and a second plurality of disparate light sources. Each plurality of disparate light sources includes a first light source that generates a first light beam having a first center wavelength and a second light source that generates a second light beam having a second center wavelength that is different than the first center wavelength. The first plurality of disparate light sources generates a first output beam that is directed along a first central beam axis. The second plurality of disparate light sources generates a second output beam that is directed along a second central beam axis that is spaced apart from the first central beam axis by at least approximately sixty degrees.

22 Claims, 19 Drawing Sheets

Related U.S. Application Data

(60) Provisional application No. 61/894,812, filed on Oct. 23, 2013.

(51) Int. Cl.
    *F21V 31/00*     (2006.01)
    *F21V 23/00*     (2015.01)
    *H01S 5/34*     (2006.01)
    *H01S 5/022*     (2006.01)
    *H01S 5/40*     (2006.01)
    *F21Y 115/30*     (2016.01)

(52) U.S. Cl.
    CPC .......... *F21V 31/005* (2013.01); *H01S 5/0224* (2013.01); *H01S 5/02469* (2013.01); *H01S 5/02476* (2013.01); *H01S 5/3401* (2013.01); *H01S 5/4087* (2013.01); *F21Y 2115/30* (2016.08)

(56) References Cited

U.S. PATENT DOCUMENTS

| | | |
|---|---|---|
| 7,424,042 B2 | 9/2008 | Day et al. |
| 7,466,734 B1 | 12/2008 | Day et al. |
| 7,492,806 B2 | 2/2009 | Day et al. |
| 7,535,656 B2 | 5/2009 | Day et al. |
| 7,535,936 B2 | 5/2009 | Day et al. |
| 7,733,925 B2 | 6/2010 | Pushkarsky et al. |
| 7,796,341 B2 | 9/2010 | Day et al. |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 8,442,081 B2 | 5/2013 | Marsland, Jr. et al. |
| 8,467,430 B2 | 6/2013 | Caffey et al. |
| 8,565,275 B2 | 10/2013 | Pushkarsky et al. |
| 8,718,105 B2 | 5/2014 | Weida et al. |
| 8,774,244 B2 | 7/2014 | Pushkarsky et al. |
| 9,791,113 B2 * | 10/2017 | Whitmore ............... F21L 4/022 |
| 2010/0283404 A1 | 11/2010 | Thoren, Sr. |
| 2011/0222566 A1 * | 9/2011 | Weida .................... B82Y 20/00 372/25 |

* cited by examiner

LIGHT SOURCE ASSEMBLY WITH MULTIPLE, DISPARATE LIGHT SOURCES

RELATED APPLICATIONS

This application is a continuation-in-part of U.S. application Ser. No. 14/522,290 filed on Oct. 23, 2014, and entitled "LIGHT SOURCE ASSEMBLY WITH MULTIPLE, DISPARATE LIGHT SOURCES" which is currently pending. As far as is permitted, the contents of U.S. application Ser. No. 14/522,290 are incorporated herein by reference. Additionally, U.S. application Ser. No. 14/522,290 claims priority on U.S. Provisional Application Ser. No. 61/894,812, filed Oct. 23, 2013 and entitled "LIGHT SOURCE ASSEMBLY WITH MULTIPLE, DISPARATE LIGHT SOURCES". As far as permitted, the contents of U.S. Provisional Application Ser. No. 61/894,812 are incorporated herein by reference.

BACKGROUND

A signal beacon or flashlight can be utilized in conjunction with a detector assembly for various purposes in a military environment and in a civilian environment, and on land or in a maritime environment. For example, a signal beacon or flashlight can be utilized in conjunction with a detector assembly for purposes of search and rescue, identification (e.g., of friend or foe), surveillance, targeting, and/or navigation, both on land and/or in a maritime environment. There is an ongoing desire to improve the capabilities of a signal beacon or flashlight that can be used for such applications.

SUMMARY

The present invention is directed toward a light source assembly for use by a user. In various embodiments, the light source assembly includes a housing assembly and at least two sets of disparate light sources that are coupled to the housing assembly. The at least two sets of disparate light sources include (i) a first plurality of disparate light sources; and (ii) a second plurality of disparate light sources. Each of the sets of disparate light sources includes a first light source that is configured to generate a first light beam having a first center wavelength and a second light source that is configured to generate a second light beam having a second center wavelength that is different than the first center wavelength. The first plurality of disparate light sources generates at least one first output beam that is directed away from the housing assembly along and about a first central beam axis. The second plurality of disparate light sources generates at least one second output beam that is directed away from the housing assembly along and about a second central beam axis.

In certain embodiments, the at least one first output beam includes a first, first light beam; and the at least one second output beam includes a second, first light beam. Further, in such embodiment, the first central beam axis can be spaced apart from the second central beam axis by at least approximately sixty degrees.

Additionally, in some embodiments, the first central beam axis is spaced apart from the second central beam axis by at least approximately ninety degrees.

In certain embodiments, the at least two sets of disparate light sources further includes a third plurality of disparate light sources. In such embodiments, the third plurality of disparate light sources generates at least one third output beam that is directed away from the housing assembly along and about a third central beam axis. Additionally, the third central beam axis can be spaced apart from each of the first central beam axis and the second central beam axis by at least approximately sixty degrees. Further, in some such embodiments, the at least two sets of disparate light sources further includes a fourth plurality of disparate light sources. In such embodiments, the fourth plurality of disparate light sources generates at least one fourth output beam that is directed away from the housing assembly along and about a fourth central beam axis. Moreover, the fourth central beam axis can be spaced apart from each of the first central beam axis, the second central beam axis and the third central beam axis by at least approximately sixty degrees. Alternatively, in one such embodiment, each of the central beam axes can be spaced apart from each of the other central beam axes by approximately ninety degrees.

Still further, in certain embodiments, the at least one first output beam, the at least one second output beam, the at least one third output beam, and the at least one fourth output beam provide approximately 360-degree azimuthal coverage about the housing assembly.

In some embodiments, the light source assembly further includes a temperature control assembly that is coupled to the housing assembly, the temperature control assembly being configured to dissipate heat that is generated during use of the light source assembly.

Additionally, in certain embodiments, the light source assembly further includes a seal housing assembly that is configured to provide a sealed environment about the at least two sets of disparate light sources.

Further, in some embodiments, the light source assembly further includes a control system that is electrically coupled, but is positioned remotely from the at least two sets of disparate light sources. The control system can include a controller that selectively controls electrical power from a power source that is provided to each of the at least two sets of disparate light sources. Still further, the control system can further include a selector assembly that is electrically connected to the controller, the selector assembly being selectively controllable by the user to select a mode of operation for the at least two sets of disparate light sources.

Additionally, in some embodiments, the present invention is also directed toward a light source assembly for use by a user, the light source assembly including (A) a housing assembly; and (B) at least two sets of disparate light sources that are coupled to the housing assembly, the at least two sets of disparate light sources including (i) a first plurality of disparate light sources; and (ii) a second plurality of disparate light sources; wherein each of the sets of disparate light sources includes a first light source that is configured to generate a first light beam having a first center wavelength and a second light source that is configured to generate a second light beam having a second center wavelength that is different than the first center wavelength; wherein the first plurality of disparate light sources generates at least one first output beam that is directed away from the housing assembly along and about a first central beam axis; wherein the second plurality of disparate light sources generates at least one second output beam that is directed away from the housing assembly along and about a second central beam axis; and wherein the at least one first output beam and the at least one second output beam provide at least approximately 180-degree azimuthal coverage about the housing assembly.

It should be understood that although a number of different embodiments of a light source assembly are illustrated and described herein below, one or more features of any one embodiment can be combined with one or more features of one or more of the other embodiments, provided that such combination satisfies the intent of the present invention.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Embodiments of the present invention are described herein in the context of a light source assembly with multiple, disparate light sources. More particularly, in various embodiments, the light source assembly can be utilized in conjunction with a detector assembly for various purposes and in various environments, e.g., in military or civilian environments, and on land or in maritime environments. Additionally, in certain applications, the light source assembly can be utilized in conjunction with the detector assembly regardless of the position of the detector assembly relative to the light source assembly.

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-related and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
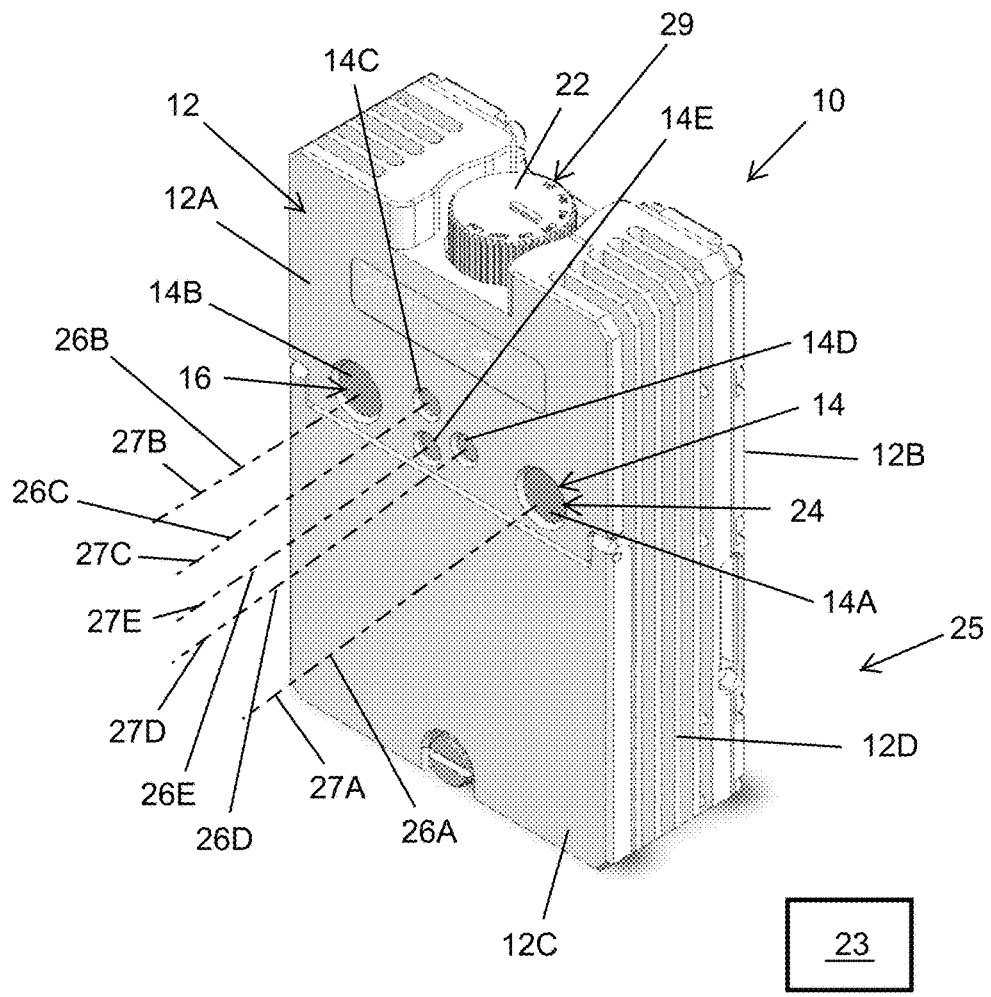
FIG. 1A is a simplified front perspective view of an embodiment of a light source assembly having features of the present invention.

FIG. 1A is a simplified front perspective view of an embodiment of a light source assembly 10 having features of the present invention. The design of the light source assembly 10 can be varied to suit the specific requirements and intended uses of the light source assembly 10. As illustrated, in various embodiments, the light source assembly 10 includes a housing assembly 12, a plurality of disparate light sources 14, an optical assembly 16, a controller 18 or circuit board (illustrated in FIG. 1D), a power source 20 (illustrated in FIG. 1E), and a selector assembly 22, e.g., a switch or dial. Alternatively, the light source assembly 10 can be designed with more or fewer components than those specifically illustrated and described in this embodiment. For example, in one such alternative embodiment, the light source assembly 10 can be designed without the optical assembly 16.

As an overview, the present invention is directed to a light source assembly 10 that can be used as a beacon or flashlight for various purposes, in conjunction with a detector assembly 23 (illustrated as a box). For example, in various applications, the light source assembly 10 can be used with the detector assembly 23 for purposes of identification, surveillance, search and rescue, targeting, navigation and/or communication. In certain embodiments, the detector assembly 23 can be a camera that is adapted to selectively detect one or more of the plurality of disparate light sources 14. Moreover, in some embodiments, as discussed herein below, the selector assembly 22 can be manually operated by a user so as to allow the user to select from various possible selector settings, and thus various possible modes of operation, based on the needs of the user at any given time.

As utilized herein, it should be appreciated that the combination of the light source assembly 10 and the detector assembly 23 can be referred to generally as an "operational assembly". During use of the operational assembly 25, the light source assembly 10 is utilized such that any and all of the plurality of disparate light sources 14 can be selectively activated, and the detector assembly 23 is utilized to selectively detect output beams from each of the plurality of disparate light sources 14.

In one application, for identification, e.g., in military operations, it is important to be able to quickly and accurately identify any individual, group, vehicle or device as friend or foe. In this application, the individuals or groups (e.g., soldiers), vehicles and/or devices could have light source assemblies 10 that can utilize the disparate light sources 14 alternatively and/or at specifically designated pulse rates (i.e. the light source assembly 10 is fully programmable such that the disparate light sources 14 can be coded in any suitable or desired manner) to identify the owner as friendly. Conversely, absence of and/or non-properly coded usage of such light source assemblies 10 can be interpreted as the owner being a foe. Additionally, in such applications, the light source assembly 10 can be handheld, uniform-mounted, helmet-mounted, and/or mounted on a portion of the vehicle or device. Moreover, the light source assembly 10 can be pointed (similar to a flashlight) to identify something.

In another application, a person in charge of the command and control of a battlefield will want to keep track of the relative positions of people and military equipment. As provided herein, each person or each piece of military equipment can include a light source assembly 10 that is controlled to selectively activate disparate light sources 14 and/or pulse the light sources 14 at a different rate (coded in any suitable or desired manner). In such application, the different light sources 14 and/or different pulse rates can be recognized to locate and individually identify the location of multiple assets based on the sequence of the pulsing of the beams of the light sources using a detector assembly 23 that captures images of the battlefield.

In still another application, i.e. for surveillance, one or more light source assemblies 10 could be used to define a search area for the detector assembly 23. In this application, something moving in front of the light source assembly 10 would result in a disappearance of signal that could be used to trigger an event, much like near-infrared diodes are used in applications such as making sure that the path is clear before closing a garage door.

In yet another application, i.e. for use in search and rescue operations, life rafts, life vests, or soldiers' kits could all include one or more light source assemblies 10 that could be activated in an emergency. In such application, the emitted signal from the light source assembly 10 would allow easier, faster and more accurate spotting with the detector assembly 23, and could also be invisible to hostile forces if the emitted and detected light sources 14 are not widely used. Additionally, in this application, the light sources 14 can be viewed day and night, and in inclement conditions for search and rescue operations.

In another alternative application, i.e. for targeting, a light source assembly 10 could be placed on a target of interest surreptitiously, and left operating for later targeting with a detector assembly 23.

In still another alternative application, i.e. for navigation, one or more light source assemblies 10 can be used to help navigate in conditions such as dust and fog, and/or when normal visibility may be otherwise impaired. In this application, multiple light source assemblies 10 could be used to define roads or runways.

In still yet another application, i.e. for use in a maritime environment, one or more light source assemblies 10 can be mounted on any size boat or ship (or other suitable maritime vehicle) for use in any of the above-noted applications. For example, in alternative applications in the maritime environment, the one or more light sources can be used for identification purposes, asset command and control, surveillance, search and rescue operations, targeting and/or navigation.

Additionally, it is understood that the light source assembly 10 can be utilized on or in conjunction with any suitable type of vehicle. For example, in addition to the maritime vehicles noted above, in certain non-exclusive alternative applications, the light source assembly 10 can also be used on or in conjunction with a ground vehicle (e.g., car, truck, bus, tank, etc.), an air vehicle (e.g., helicopter, fixed-wing aircraft, etc.), or another suitable type of vehicle.

As provided herein, in various applications, any information can be coded in the beacon signal emitted by the light source assembly 10 by adjusting the specific light sources 14 that are activated at any given time and/or the pulse rate of the light sources 14 of the light source assembly 10. Stated in another manner, the light source assembly 10 can be fully programmable to selectively activate any and all of the light sources 14 in any desired manner. For example, in one non-exclusive application, the pulse rate of the light sources 14 can be adjusted to provide a message in Morse code. Additionally, in certain embodiments, the length and timing of each pulse can be long enough to be effectively captured by the detector assembly 23. For example, each pulse can be longer than the exposure time of the detector assembly 23 to make sure the pulse is captured by the detector assembly 23. Further, in one embodiment, the pulse rate of the light source assembly 10 can be synchronized with the capture rate of the detector assembly 23. With this design, the light source assembly 10 can be controlled to generate the desired light beam(s) while the detector assembly 23 is capturing such light. As one example, the detector assembly 23 can emit a signal (e.g., a RF signal) that is received by the light source assembly 10 to synchronize them. Alternatively, the detector assembly 23 and one or more of the light source assemblies 10 can be synchronized prior to the beginning of the operation. Still alternatively, the detector assembly 23 and the light source assemblies 10 can receive a signal from a GPS that can be used to synchronize the devices.

It should be noted that either physical, inductive, or radio frequency signals can be used to program the coding of pulses (pulse width, pulse rate, pulse repetition, Morse, etc.) of any of the light sources 14.

Additionally, in certain embodiments, the light source assembly 10 is designed to be small, portable, lightweight, stable, rugged, easy to manufacture, reliable, efficient for longer use of the power source 20, and relatively inexpensive to manufacture. Further, the light source assembly 10 is further designed to be usable at sufficient distances that the signals can be detected from outside a danger zone, e.g., in certain applications, the light source assembly 10 can have a range of greater than three kilometers. As a result thereof, the light source assembly 10 can be used in many applications, such as those specifically noted above, as a signal beacon or flashlight.

The housing assembly 12 retains various components of the light source assembly 10. For example, in certain embodiments, the plurality of disparate light sources 14, the optical assembly 16, the controller 18, the power source 20 and the selector assembly 22 can all be coupled to, secured to, and/or retained substantially within the housing assembly 12. Alternatively, in other embodiments, one or more of the controller 18, the power source 20 and the selector assembly 22 can be maintained outside the housing assembly 12.

The design of the housing assembly 12 can be varied. In the embodiment illustrated in FIG. 1A, the housing assembly 12 includes a housing front 12A, a housing rear 12B, a power compartment cover 12C, and a plurality of heat spreaders 12D, e.g., fins. Alternatively, the housing assembly 12 can include more or fewer components than specifically illustrated in this embodiment.

As shown, the housing front 12A can include a plurality of housing apertures 24, with each housing aperture 24 being aligned to allow for the emitting and directing of the plurality of disparate light sources 14 out of and/or away from the housing assembly 12 and away from the light source assembly 10, such that the light sources 14 can be quickly, easily and accurately detected by the detector assembly 23. In particular, in this embodiment, the housing front 12A includes five housing apertures 24 to allow for the selective and/or alternative emitting and directing of five disparate light sources 14 from the light source assembly 10. Alternatively, the housing front 12A can include greater than five or fewer than five housing apertures 24. For example, in some embodiments, more than one light source 14 can be directed away from the housing assembly 12 through a common housing aperture 24, thus requiring fewer housing apertures 24 than light sources 14 in such embodiments. Still alternatively, the housing apertures 24 can be located in a different portion of the housing assembly 12.

Figure 1B:
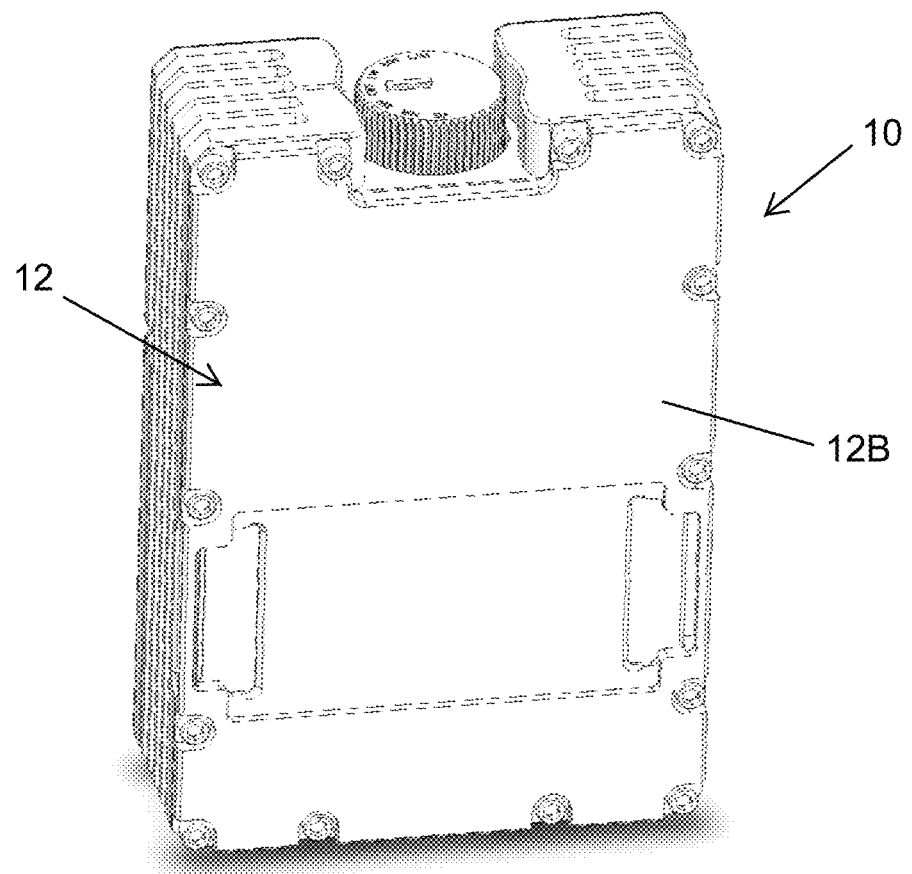
FIG. 1B is a simplified rear perspective view of the light source assembly of FIG. 1A.

In certain embodiments, the housing rear 12B provides the necessary housing for the various components of the housing assembly 10 that are positioned at or near the rear of the light source assembly 10. FIG. 1B is a simplified rear perspective view of the light source assembly 10 of FIG. 1A. More particularly, FIG. 1B more clearly illustrates one non-exclusive alternative design for the housing rear 12B of the housing assembly 12.

Returning to FIG. 1A, the power compartment cover 12C protects and/or covers the power source 20 as the power source 20 is coupled to, secured to, and/or positioned within the housing assembly 12. In one embodiment, the power compartment cover 12C can be selectively and independently removed and/or opened to allow for any changes or modifications to the power source 20.

The heat spreaders 12D help to spread and/or transfer heat from the light source assembly 10, i.e. to effectively move heat away from the light sources 14. More particularly, in one non-exclusive alternative embodiment, the heat spreaders 12D can comprise a plurality of fins that provide greater surface area for the housing assembly 12 as a means to more effectively transfer heat away from the light sources 14 and/or other components of the light source assembly 10 and into the surrounding environment. Alternatively, the heat spreaders 12D can have a different design than that shown in the Figures. Still alternatively, the housing assembly 12 can be designed without the heat spreaders 12D.

It should be appreciated that the light source assembly 10 is designed to provide natural convection cooling for the light sources 14 and the other components of the light source assembly 10. With such design, the housing assembly 12 can be designed without the heat spreaders 12D; although the heat spreaders 12D, as described, can further enhance the ability of the light source assembly 10 to effectively move heat away from the light sources 14 and the other components of the light source assembly 10.

Additionally, the overall shape and size of the housing assembly 12 can be varied to suit the specific requirements of the light source assembly 10. For example, in certain embodiments, the housing assembly 12 can be substantially rectangular box-shaped and can have a length of between approximately two inches and four inches, a width of between approximately two inches and three inches, and a thickness of between approximately 0.5-1.25 inches. In one non-exclusive embodiment, the housing assembly 12 is substantially rectangular box shaped, and has a length of 3.75 inches, a width of 2.5 inches, and a thickness of one inch. Alternatively, in other suitable embodiments, the housing assembly 12 can be other that substantially rectangular box-shaped, and/or the housing assembly 12 can have a length, width and thickness that are greater than or less than the specific dimensions discussed herein above. For example, in certain such alternative embodiments, the housing assembly 12 can be substantially square box-shaped, cylindrical disk-shaped, hexagonal disk-shaped, octagonal disk-shaped, or another suitable shape.

In particular, in yet another non-exclusive example, the housing assembly 12 has a cylindrical shape with a diameter of between approximately one inch and four inches and a thickness of between approximately 0.5-3 inches.

The number, type, design, positioning and orientation of the disparate light sources 14 can be varied depending on the specific requirements of the light source assembly 10. In the embodiment illustrated in FIG. 1A, the light source assembly 10 includes five disparate light sources 14, i.e. a first light source 14A, a second light source 14B, a third light source 14C, a fourth light source 14D and a fifth light source 14E that are each coupled to, secured to, and/or positioned substantially within the housing assembly 12. Alternatively, the light source assembly 10 can include greater than five or fewer than five disparate light sources 14. Still alternatively, the plurality of light sources 14 can be grouped together in any suitable manner. Stated in another fashion, the plurality of light sources 14 can be arranged with one or more disparate light sources 14 positioned in one or more different general locations within the housing assembly 12.

Additionally, each of the light sources 14 can be designed and/or individually tuned to provide an output beam having a specific wavelength. For example, in one non-exclusive alternative embodiment, (i) the first light source 14A can be a long-wavelength infrared light source that generates and/or emits a first output beam 26A having a center wavelength that is in a long-wavelength infrared range of between approximately eight micrometers and fifteen micrometers; (ii) the second light source 14B can be a mid-wavelength infrared light source that generates and/or emits a second output beam 26B having a center wavelength that is in a mid-wavelength infrared range of between approximately three micrometers and eight micrometers; (iii) the third light source 14C can be a short-wavelength infrared light source that generates and/or emits a third output beam 26C having a center wavelength that is in a short-wavelength infrared range of between approximately one point four (1.4) micrometers and three micrometers; (iv) the fourth light source 14D can be a near-infrared light source that generates and/or emits a fourth output beam 26D having a center wavelength that is in a near-infrared wavelength range of between approximately seven hundred nanometers (i.e. 0.70 micrometers) and one point four (1.4) micrometers; and (v) the fifth light source 14E can be a visible light source that generates and/or emits a fifth output beam 26E having a center wavelength that is in a visible wavelength range of between approximately three hundred eighty and seven hundred nanometers. Alternatively, one or more of the light sources 14A-14E can be different than those specifically identified herein above (e.g., the light sources 14A-14E can have different wavelengths such as those for a far-infrared light source, an ultraviolet light source, an X-ray light source, or another appropriate light source), and/or the light sources 14A-14E can be positioned and/or oriented relative to one another in a different manner than is shown in FIG. 1A.

Further, as shown in FIG. 1A, each of the light sources 14A-14E generates and/or emits an independent output beam. In particular, (i) the first light source 14A generates and/or emits the first output beam 26A (illustrated with a dashed line), e.g., a long-wavelength infrared output beam, along a first beam axis 27A; (ii) the second light source 14B generates and/or emits the second output beam 26B (illustrated with a dashed line), e.g., a mid-wavelength infrared output beam, along a second beam axis 27B; (iii) the third light source 14C generates and/or emits the third output beam 26C (illustrated with a dashed line), e.g., a short-wavelength infrared output beam, along a third beam axis 27C; (iv) the fourth light source 14D generates and/or emits the fourth output beam 26D (illustrated with a dashed line), e.g., a near-wavelength infrared output beam, along a fourth beam axis 27D; and (v) the fifth light source 14E generates and/or emits the fifth output beam 26E (illustrated with a dashed line), e.g., a visible light output beam, along a fifth beam axis 27E. In some embodiments, such as the embodiment illustrated in FIG. 1A, each of the output beams 26A-26E can be spaced apart from and substantially parallel to each of the other output beams 26A-26E. Thus, in such embodiments, each of the beam axes 27A-27E can be spaced apart from and substantially parallel to each of the other beam axes 27A-27E.

Alternatively, in other embodiments, one or more of the output beams 26A-26E can be directed away from the housing assembly 12 at an angle relative to any of the other output beams 26A-26E, such that the output beams 26A-26E, and thus the beam axes 27A-27E, are not parallel to one another. For example, in some such alternative embodiments, one or more of the output beams 26A-26E can be directed away from the housing assembly 12 through a different face of the housing assembly 12, e.g., the first output beam 26A and the second output beam 26B can be directed away from a front surface 344A (illustrated in FIG. 3) of the housing assembly 12, the third output beam 26C can be directed away from a first side surface 344B (illustrated in FIG. 3) of the housing assembly 12, the fourth output beam 26D can be directed away from a rear surface 344C (illustrated in FIG. 3) of the housing assembly 12, and the fifth output beam 26E can be directed away from a second side surface 344D (illustrated in FIG. 3) of the housing assembly 12. It should be appreciated that in various alternative embodiments, each of the output beams 26A-26E can be directed away from the housing assembly 12 in any desired direction(s), away from any surface(s) of the housing assembly 12, and/or through any housing aperture(s) 24.

In various embodiments, each of the output beams 26A-26E can be viewable with the detector assembly 23. Stated in another manner, during use, the detector assembly 23 can selectively detect each of the output beams 26A-26E that are generated and/or emitted by the light sources 14A-14E. Additionally, in some embodiments, the output beams 26A-26E can have high peak (maximum) pulsed (or continuous wave) intensities, e.g., greater than one watt, greater than two watts, etc., that enable viewing of the output beams 26A-26E over large distances. Moreover, one or more of the output beams 26A-26E can be viewable day and night, and through inclement weather conditions (e.g., fog, rain, snow, smoke, clouds, or dust in the atmosphere).

It should be appreciated that the use of the terms "first light source", "second light source", "third light source", "fourth light source", and "fifth light source" is merely for purposes of convenience and ease of illustration, and any of the light sources 14A-14E can be equally referred to as the "first light source", the "second light source", the "third light source", the "fourth light source", and/or the "fifth light source". Similarly, it should also be appreciated that the use of the terms "first output beam", "second output beam", "third output beam", "fourth output beam", and "fifth output beam" is merely for purposes of convenience and ease of illustration, and any of the output beams 26A-26E can be equally referred to as the "first output beam", the "second output beam", the "third output beam", the "fourth output beam", and/or the "fifth output beam". Still similarly, it should further be appreciated that the use of the terms "first beam axis", "second beam axis", "third beam axis", "fourth beam axis", and "fifth beam axis" is merely for purposes of convenience and ease of illustration, and any of the beam axes 27A-27E can be equally referred to as the "first beam axis", the "second beam axis", the "third beam axis", the "fourth beam axis", and/or the "fifth beam axis".

In certain embodiments, the optical assembly 16 can be provided to enable any desired focusing, shaping and directing of the output beams 26A-26E from each of the plurality of disparate light sources 14A-14E. For example, in certain embodiments, the optical assembly 16 can include one or more lenses, mirrors, diffractive optical elements (DOE) and/or other optical elements to enable any desired focusing, shaping and directing of the output beams 26A-26E from each of the plurality of disparate light sources 14A-14E. Additionally and/or alternatively, the optical assembly 16 can include a window designed such that the output beams 26A-26E are not collimated, i.e. are uncollimated. Still alternatively, one or more of the output beams 26A-26E can be directed away from the housing assembly 12 of the light source assembly 10 without the need for any optical elements. In such embodiments, each of the output beams 26A-26E will again be uncollimated.

The controller 18 (illustrated in FIG. 1D) is coupled to, secured to, and/or positioned substantially within the housing assembly 12. During use, the controller 18 enables the necessary and desired control of the operation of the light source assembly 10, i.e. the selective operation of one or more of the plurality of disparate light sources 14, by selectively controlling the electrical power that is provided by the power source 20 to the light sources 14A-14E. In certain applications, the controller 18 selectively directs current from the power source 20 to one of the light sources 14 such that only one light source 14 is activated at a time. Alternatively, in other applications, the controller 18 can selectively direct current from the power source 20 to one of the light sources 14, e.g., the first light source 14A, in a first duty cycle, and direct current from the power source 20 to another of the light sources 14, e.g., the second light source 14B, in a second duty cycle that is different from the first duty cycle. In such embodiments, the controller 18 can selectively activate multiple light sources 14 such that any two of the output beams 26A-26E can be generated in an alternating (or random) pattern. Still alternatively, in still other embodiments, the controller 18 can selectively direct current from the power source 20 to multiple light sources 14 so as to enable multiple light sources 14 to be activated at any given time. One non-exclusive embodiment of an exemplary controller 18 that can be used with the present invention is illustrated in and will be described in greater detail in relation to FIG. 1D.

The power source 20 is coupled to, secured to, and/or positioned substantially within the housing assembly 12. In various embodiments, the power source 20 provides the necessary and desired electrical power to effectively and efficiently operate the light source assembly 10, i.e. to selectively activate and control one or more of the plurality of disparate light sources 14.

Figure 1C:
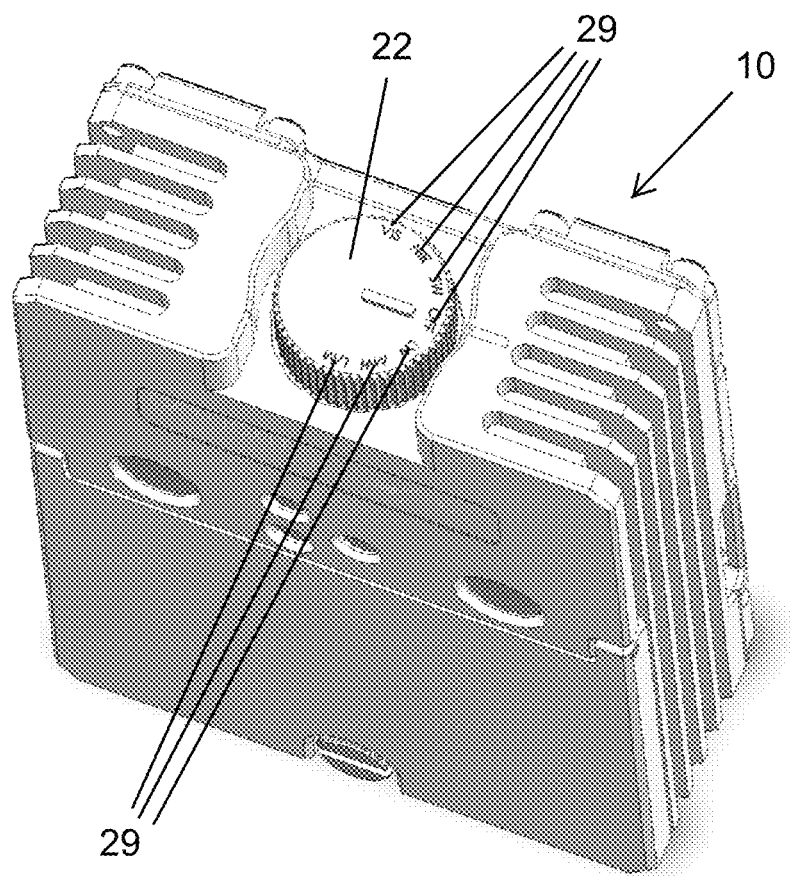
FIG. 1C is a simplified top perspective view of the light source assembly of FIG. 1A.

The selector assembly 22 is electrically connected to the controller 18. In certain embodiments, the selector assembly 22 enables the user to selectively choose between a variety of potential modes of operation via a plurality of selector settings 29. The potential modes of operation and/or the specific selector settings 29 can be varied to suit the specific design requirements of the light source assembly 10. FIG. 1C is a simplified top perspective view of the light source assembly 10 of FIG. 1A, which provides a clear illustration of some of the selector settings 29 available in this embodiment via the selector assembly 22. For example, the selector assembly 22 shows that the user can select between the following modes of operation and/or selector settings 29: (i) on, with the long-wavelength infrared light source 14A (illustrated in FIG. 1A) and the mid-wavelength infrared light source 14B (illustrated in FIG. 1A) operating in an alternating manner; (ii) on, using the mid-wavelength infrared light source 14B; (iii) on, using the long-wavelength infrared light source 14A; (iv) on, using the short-wavelength infrared light source 14C (illustrated in FIG. 1A); (v) on, using the near-infrared light source 14D (illustrated in FIG. 1A); (vi) on, using the visible light source 14E (illustrated in FIG. 1A); and (vii) off. It should be appreciated that the potential modes of operation and/or selector settings 29 can be expanded to include a combined and/or alternating use of any combination of the plurality of light sources 14A-14E illustrated specifically herein. Additionally, it should further be appreciated that the potential modes of operation and/or selector settings 29 can be expanded to include individual and/or combined (e.g., alternating) use of any other light sources that may potentially be included within the light source assembly 10.

Additionally, in certain embodiments, the selector assembly 22 can further be adjusted by the user to enable the selective adjustment of a pulse rate and/or duty cycle of the emission of the output beams 26A-26E (illustrated in FIG. 1A) when the output beams 26A-26E are generated and/or emitted in a pulsed mode of operation, and/or to enable one or more of the output beams 26A-26E to be generated and/or emitted in a continuous wave mode of operation. For example, when it is desired by the user to generate and/or emit the output beams 26A-26E is a pulsed mode of operation, the user can make a selection via the selector assembly 22 such that the controller 18 (illustrated in FIG. 1D) pulses the power, i.e. the current, that is directed from the power source 20 to the light source 14 over time. In one non-exclusive setting, the duty cycle can be approximately fifty percent, e.g. the power can be directed to the light source 14 for a predetermined period of time and alternately the power is not directed to the light source 14 for the same predetermined period of time. Alternatively, the duty cycle can be greater than or less than fifty percent, i.e. the power can be directed to the light source for a longer or shorter period of time than the power is not being directed to the light source 14. Further, when it is desired by the user to generate and/or emit the output beams 26A-26E in a continuous wave mode of operation, the user can make a selection via the selector assembly 22 such that the controller 18 continuously directs power, i.e. current, from the power source 20 to the light source 14.

It should be appreciated that utilizing a pulsed mode of operation can assist the light source assembly 10 in achieving more efficient and/or lower overall power usage by the power source 20, and can further inhibit the undesired generation of heat within the light source assembly 10. Moreover, it should be realized that such benefits can be achieved by utilizing a pulsed mode of operation regardless of whether the light source assembly 10 is utilizing multiple light sources 14A-14E in an alternating manner, or whether the light source assembly 10 is utilizing only a single given light source 14A-14E at any given time.

Simplified graphical illustrations of possible current inputs and beam outputs for each of the settings discussed specifically herein are illustrated and described herein below in relation to FIGS. 4A-4F, with the exception of the "off" setting where no current is provided to any of the light sources 14A-14E and no output beams 26A-26E are generated and emitted by the light source assembly 10.

Figure 1D:
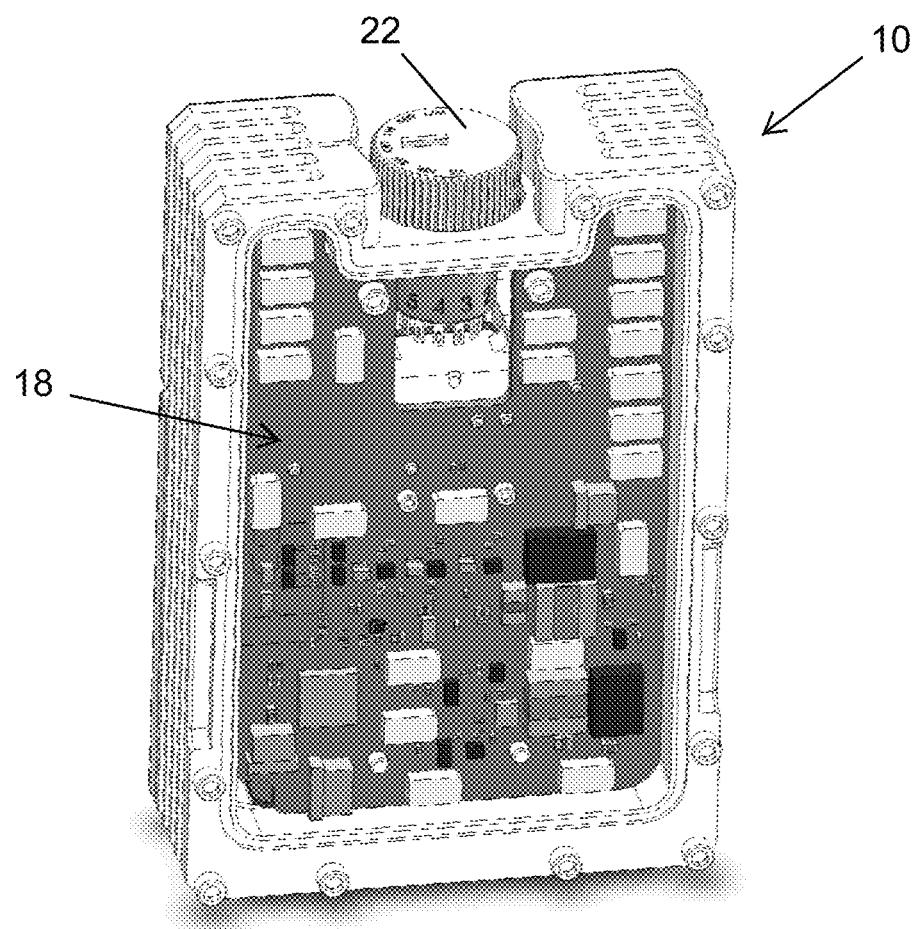
FIG. 1D is a simplified rear perspective view of a portion of the light source assembly of FIG. 1A.

FIG. 1D is a simplified rear perspective view of a portion of the light source assembly 10 of FIG. 1A. In particular, FIG. 1D is a simplified rear perspective view of the light source assembly 10 with the housing rear 12B having been removed so that certain elements, e.g., the controller 18, can be more clearly illustrated.

The controller 18 controls the operation of the light source assembly 10 including the electrical power that is directed from the power source 20 (illustrated in FIG. 1E) to each of the plurality of disparate light sources 14 (illustrated in FIG. 1A) that are included as part of the light source assembly 10. The design of the controller 18 can be varied. For example, the controller 18 can include one or more processors and circuits that are electrically connected to the selector assembly 22. With this design, the processors control the selective operation of each of the plurality of disparate light sources 14.

Additionally, as noted above, in certain embodiments, the controller 18 can direct power to one or more of the light sources 14 in a pulsed fashion to minimize heat generation in, and power consumption by the light sources 14, while still achieving the desired average optical power of the output beams 26A-26E (illustrated in FIG. 1A). This enables more efficient use of the power source 20 such that the power source 20, e.g., one or more batteries, can be used for a longer period of time as compared to when used in a continuous wave mode of operation. Such low battery drain can be crucial for long life of the light source assembly 10 when being used in the field. Additionally, this helps to minimize the heat generated. As a result thereof, this increases the number of operational environments in which the assembly can be used. For example, this allows the assembly to be used in a high temperature desert.

It should be noted that in certain embodiments, active cooling (e.g. with a fan or TEC) of the assembly is not required because of the unique design provided herein. Alternatively, in certain embodiments, the assembly can be actively cooled.

Further, in certain embodiments, the controller 18 can include a boost converter (e.g., a DC-to-DC power converter), a capacitor assembly, a reduction DC-to-DC power converter, a switch assembly, and a processor that can be utilized in conjunction with one another to enable the controller 18 to effectively and efficiently utilize power from the power source 20 to selectively operate each of the plurality of disparate light sources 14.

Figure 1E:
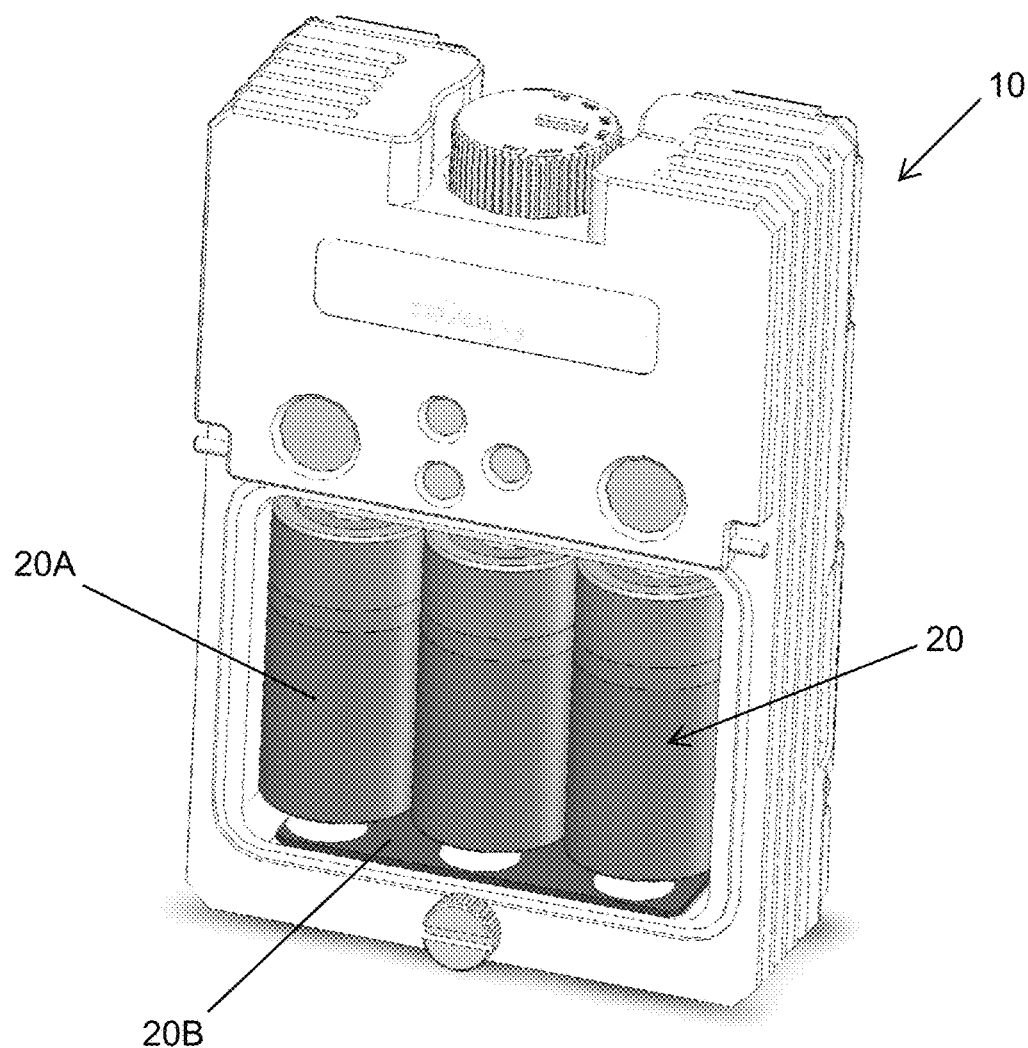
FIG. 1E is a simplified front perspective view of a portion of the light source assembly of FIG. 1A.

FIG. 1E is a simplified front perspective view of a portion of the light source assembly 10 of FIG. 1A. In particular, FIG. 1E is a simplified front perspective view of the light source assembly 10 with the power compartment cover 12C having been removed so that certain elements, e.g., the power source 20, can be more clearly illustrated.

The power source 20 provides electrical power for the light sources 14 (illustrated in FIG. 1A) and the controller 18 (illustrated in FIG. 1D). As shown in FIG. 1E, the power source 20 can include a plurality of batteries 20A that are positioned within a battery compartment 20B. The batteries 20A provide the necessary power for full operation of the light source assembly 10. In one embodiment, as illustrated, the power source 20 can include three batteries 20A. Alternatively, the power source 20 can be designed to include greater than three or fewer than three batteries 20A. Still alternatively, the power source 20 can be designed in another manner, i.e. without the use of batteries 20A. For example, the power source 20 can be a generator or other type of external power source that is positioned outside the housing assembly 12, and the power source 20 can be electrically connected to the light source assembly 10 via one or more wires. Yet alternatively, such an external power source 20 can also be wirelessly, electrically connected to the light source assembly 10.

Figure 1F:
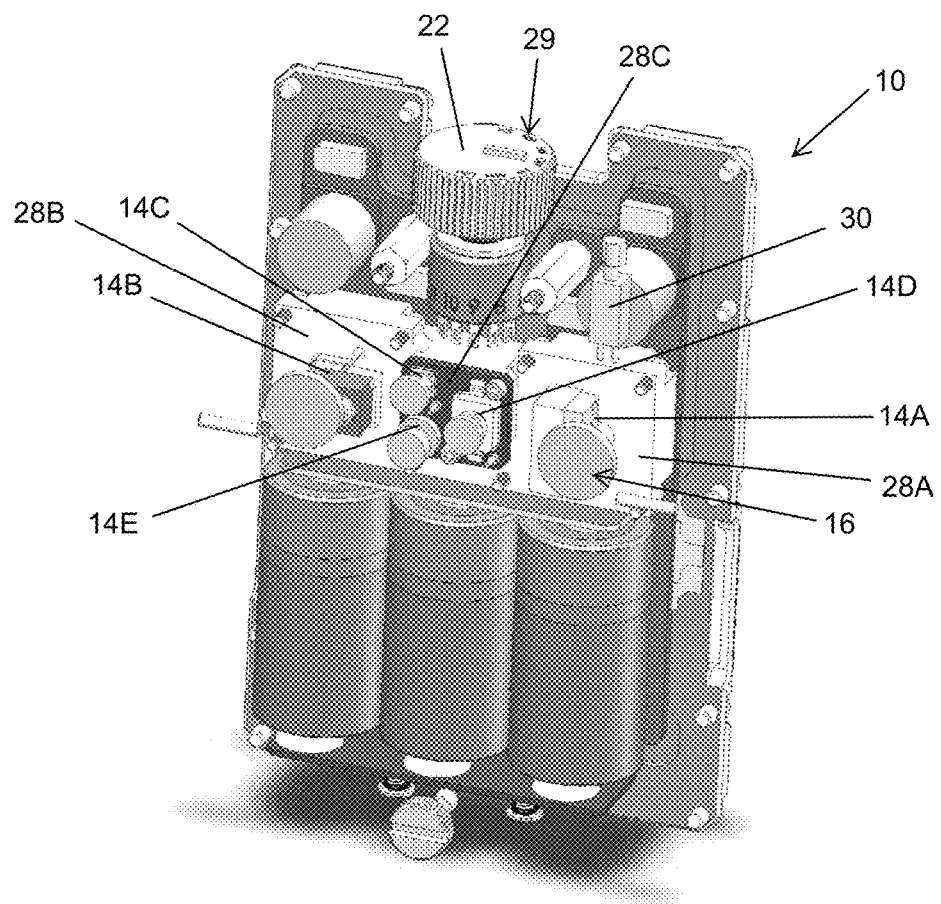
FIG. 1F is a simplified front perspective view of a portion of the light source assembly of FIG. 1A.

FIG. 1F is a simplified front perspective view of a portion of the light source assembly 10 of FIG. 1A. In particular, FIG. 1F is a simplified front perspective view of the light source assembly 10 with the housing assembly 12 having been removed for purposes of more clearly illustrating certain features and aspects of the present invention. For example, FIG. 1F illustrates certain features and aspects of the light sources 14A-14E, and the optical assembly 16 that can be provided to enable any desired focusing, shaping and directing of the output beams 26A-26E (illustrated in FIG. 1A) from each of the plurality of disparate light sources 14A-14E.

The design, positioning and mounting of each of the light sources 14A-14E can be varied to suit the specific design requirements of the light source assembly 10. In some embodiments, the first light source 14A can comprise a quantum cascade laser source (as shown in greater detail in FIG. 1G), the second light source 14B can also comprise a quantum cascade laser source (as shown in greater detail in FIG. 1H), and each of the third light source 14C, the fourth light source 14D and the fifth light source 14E can comprise LED light sources, laser diode and/or photonic crystal light sources. Alternatively, one or more of the light sources 14A-14E can have a different design.

Additionally, in certain embodiments, as shown in FIG. 1F, the first light source 14A can be mounted on a first mounting board 28A, the second light source 14B can be mounted on a second mounting board 28B, and the third light source 14C, the fourth light source 14D and the fifth light source 14E can be mounted together on a common third mounting board 28C. Additionally, in this embodiment, each of the mounting boards 28A-28C are independent of the other mounting boards 28A-28C. Alternatively, the light sources 14A-14E can be mounted in a different manner than specifically shown in FIG. 1F. For example, each of the light sources 14A-14E can be mounted on a single, common mounting board, and/or each of the light sources 14A-14E can be mounted on a separate, independent mounting board.

Further, FIG. 1F further illustrates certain variable aspects for the selector settings 29 that can be chosen by the user via the selector assembly 22.

Still further, FIG. 1F also illustrates that the light source assembly 10 can include an alert system 30. The alert system 30 can be programmable so as to alert the user when and if one or more features of the light source assembly 10 have been activated. The alert system 30 can have any suitable design. For example, in one non-exclusive embodiment, the alert system 30 can include a vibrator that vibrates when and if one or more features of the light source assembly 10 have been activated. More specifically, the alert system 30 can be used to alert the user that one or more of the output beams are being generated. The alert system 30 can also be coded such that a different alert signal is provided depending on the specific settings (e.g. specific output beams) that have been activated within the light source assembly 10.

Figure 1G:
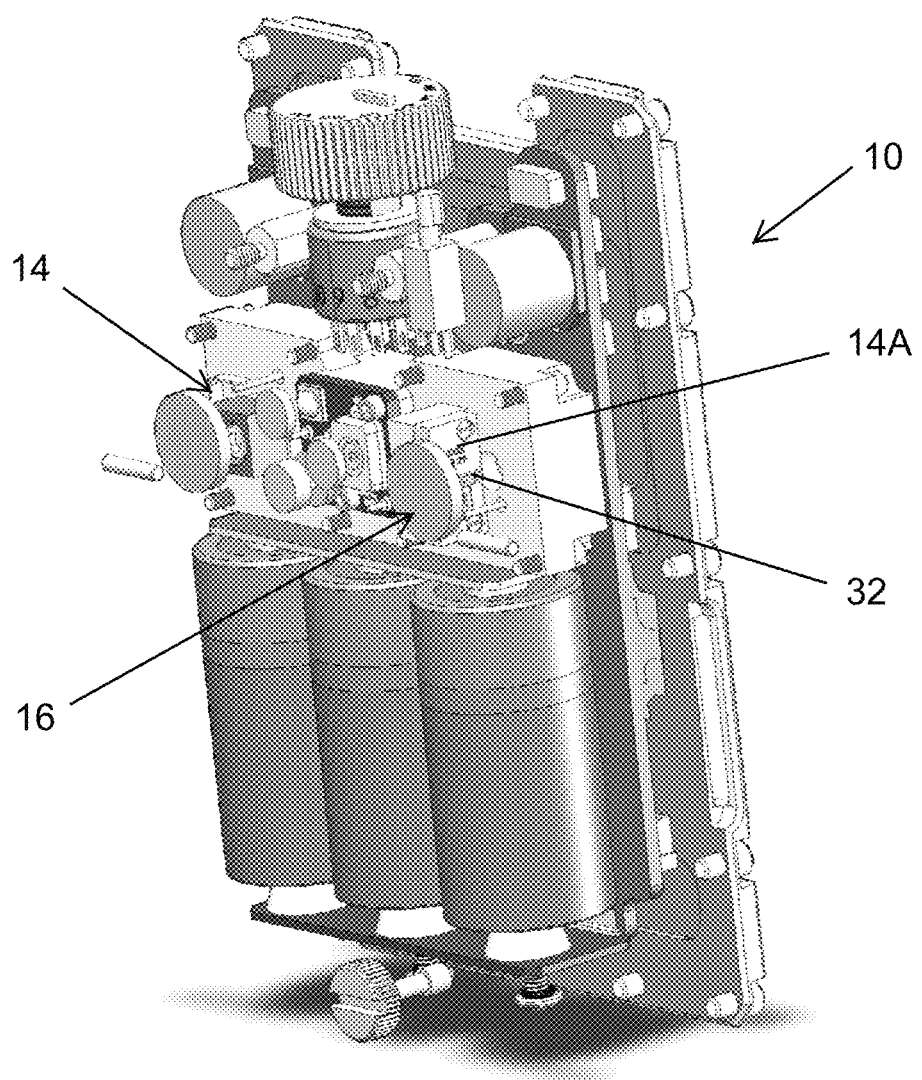
FIG. 1G is a simplified side perspective view of a portion of the light source assembly of FIG. 1A.

FIG. 1G is a simplified side perspective view of a portion of the light source assembly 10 of FIG. 1A. In particular, FIG. 1G illustrates additional features of one or more of the plurality of disparate light sources 14. For example, FIG. 1G illustrates certain features that can be included as part of the first light source 14A.

As illustrated in FIG. 1G, the first light source 14A can be a quantum cascade laser (QCL) that generates and/or emits a coherent, first output beam 26A (illustrated in FIG. 1A). More particularly, in one embodiment, the first light source 14A can include a Quantum Cascade (QC) gain medium 32 that directly emits a light beam, i.e. the first output beam 26A, that is in the long-wavelength infrared range. With this design, electrons transmitted through the QC gain medium 32 emit one photon at each of the energy steps. For example, the QC gain medium 32 can use two different semiconductor materials such as InGaAs and AlInAs (grown on an InP or GaSb substrate, for example) to form a series of potential wells and barriers for electron transitions. The thickness of these wells/barriers determines the wavelength characteristic of the QC gain medium 32. Additionally, in one, non-exclusive such embodiment, the semiconductor QCL laser chip is mounted epitaxial growth side down. Alternatively, the first light source 14A can include an interband-cascade (IC) laser, a diode laser, and/or any other laser capable of generating radiation in the appropriate long-wavelength infrared spectral region.

FIG. 1G further illustrates certain aspects of one non-exclusive embodiment of the optical assembly 16. For example, as related to the first light source 14A, the optical assembly 16 can be positioned substantially adjacent to the QC gain medium 32 in line with the lasing axis. In certain embodiments, the optical assembly 16 can include one lens or more than one lens that collimate and focus the light or can spread the light to provide other beam shapes such as top hat, doughnut, spherical configurations after the beam exits the facet of the QC gain medium 32. In one such embodiment, the optical assembly 16 can include an aspherical lens having an optical axis that is aligned with the lasing axis. Alternatively, the optical assembly 16 can have a different design relative to the first light source 14A. Still alternatively, as noted above, the first light source 14A can be provided without the optical assembly 16, and/or with the optical assembly 16 simply including a window, such that the first output beam 26A is uncollimated.

Figure 1H:
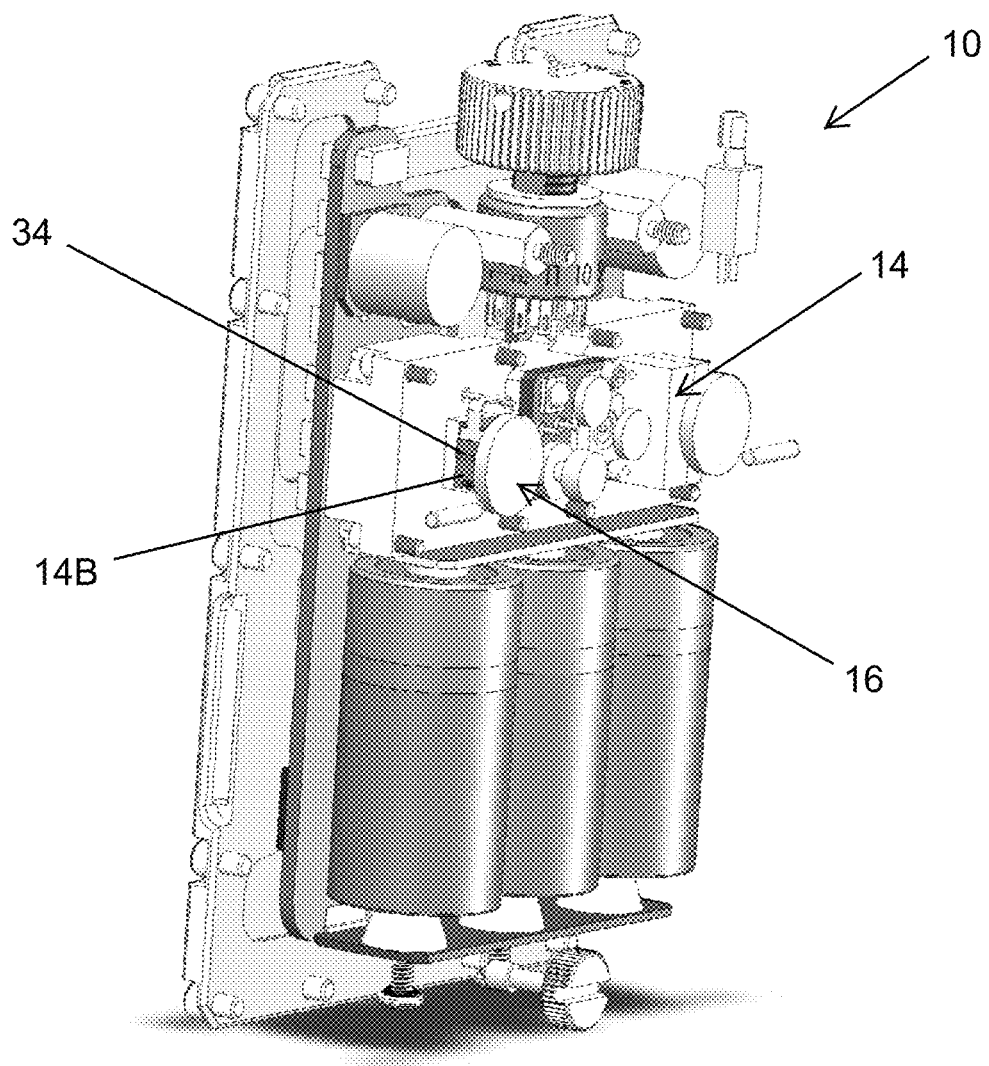
FIG. 1H is a simplified side perspective view of a portion of the light source assembly of FIG. 1A.

FIG. 1H is a simplified side perspective view of a portion of the light source assembly 10 of FIG. 1A. In particular, FIG. 1H illustrates additional features of one or more of the plurality of disparate light sources 14. For example, FIG. 1H illustrates certain features that can be included as part of the second light source 14B.

In one embodiment, the design of the second light source 14B can be somewhat similar to that of the first light source 14A. For example, as illustrated in FIG. 1H, the second light source 14B can be a quantum cascade laser (QCL) that generates and/or emits a coherent, second output beam 26B (illustrated in FIG. 1A). More particularly, in one embodiment, the second light source 14B can include a Quantum Cascade (QC) gain medium 34 that directly emits a light beam, i.e. the second output beam 26A, that is in the mid-wavelength infrared range. With this design, electrons transmitted through the QC gain medium 34 emit one photon at each of the energy steps. For example, the QC gain medium 34 can use two different semiconductor materials such as InGaAs and AlInAs (grown on an InP or GaSb substrate, for example) to form a series of potential wells and barriers for electron transitions. The thickness of these wells/barriers determines the wavelength characteristic of the QC gain medium 34. Additionally, in one, non-exclusive such embodiment, the semiconductor QCL laser chip is mounted epitaxial growth side down. Alternatively, the second light source 14B can include an interband-cascade (IC) laser, a diode laser, and/or any other laser capable of generating radiation in the appropriate mid-wavelength infrared spectral region.

FIG. 1H further illustrates certain aspects of one non-exclusive embodiment of the optical assembly 16. For example, as related to the second light source 14B, the optical assembly 16 can be positioned substantially adjacent to the QC gain medium 34 in line with the lasing axis. In certain embodiments, the optical assembly 16 can include one lens or more than one lens that collimate and focus the light or can spread the light to provide other beam shapes such as top hat, doughnut, spherical configurations after the beam exits the facet of the QC gain medium 34. In one such embodiment, the optical assembly 16 can include an aspherical lens having an optical axis that is aligned with the lasing axis. Alternatively, the optical assembly 16 can have a different design relative to the second light source 14B. Still alternatively, as noted above, the second light source 14B can be provided without the optical assembly 16, and/or with the optical assembly 16 simply including a window, such that the second output beam 26B is uncollimated.

It should be noted that in certain embodiments, the light sources 14A-14E and/or the optical assembly 16 can be positioned such that the light source assembly 10 can provide as much as a fully spherical optical output.

Figure 2A:
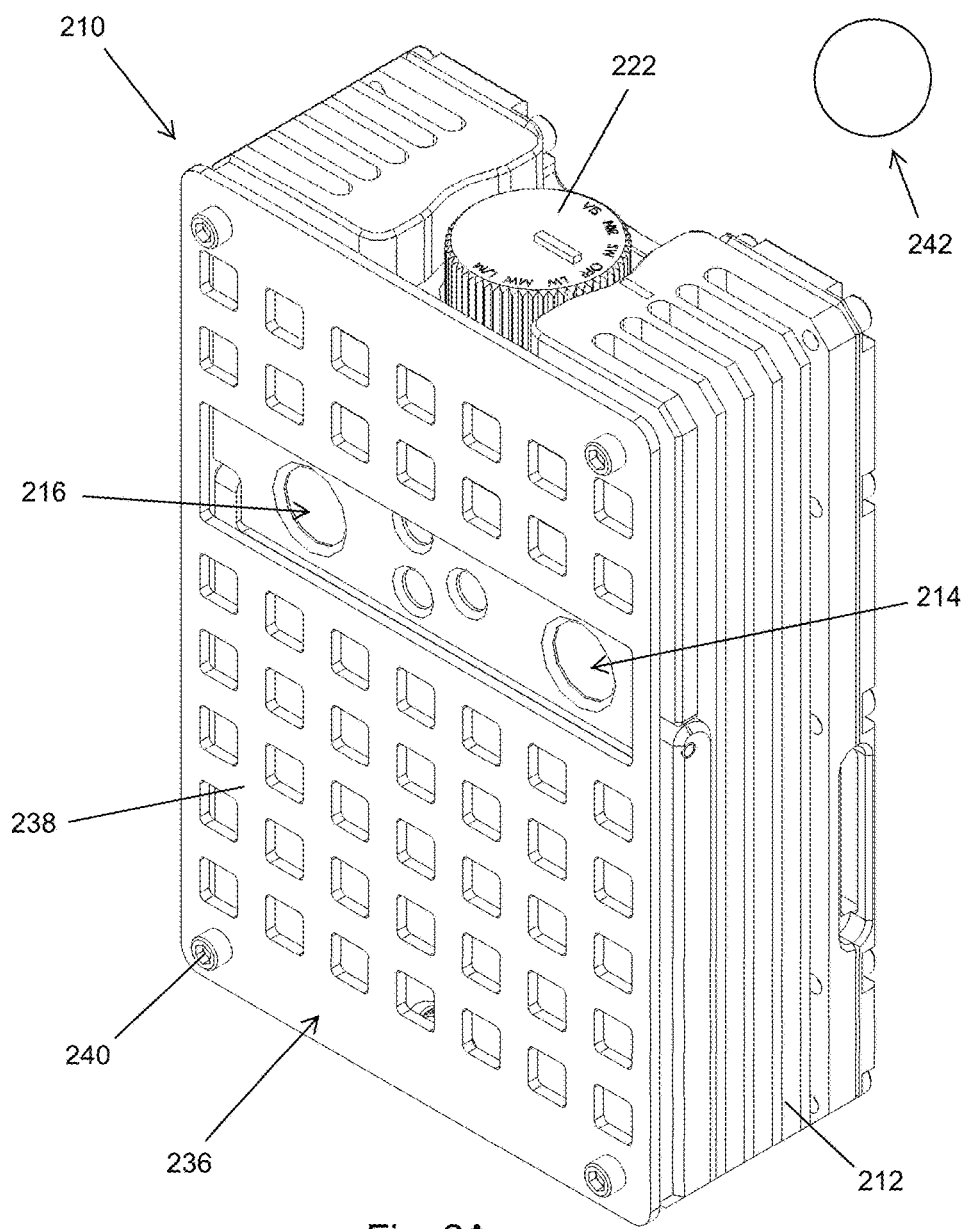
FIG. 2A is a simplified front perspective view of another embodiment of a light source assembly having features of the present invention.

FIG. 2A is a simplified front perspective view of another embodiment of a light source assembly 210 having features of the present invention. The light source assembly 210 illustrated in FIG. 2A is substantially similar to the light source assembly 10 illustrated and described herein in relation to FIGS. 1A-1H. For example, the light source assembly 210 can include a housing assembly 212, a plurality of disparate light sources 214, an optical assembly 216, a controller (not illustrated), a power source (not illustrated), and a selector assembly 222 that are substantially similar to the housing assembly 12, the plurality of disparate light sources 14, the optical assembly 16, the controller 18, the power source 20, and the selector assembly 22 illustrated and described herein in relation to FIGS. 1A-1H.

However, in this embodiment, the light source assembly 210 further includes a thermal shield 236, e.g., a solar shield, that can be positioned substantially adjacent to the housing assembly 212, e.g., substantially adjacent to the housing front (not shown) and the power compartment cover (not shown). For example, in one embodiment, the thermal shield 236 can include a shield body 238 that is coupled to the housing assembly 212, e.g., with a plurality of shield fasteners 240, such that the shield body 238 can be positioned spaced apart from the housing assembly 212. With this design, the thermal shield 236 functions to inhibit energy, e.g., heat, from contacting the housing assembly 212 and/or being conducted into the other components of the light source assembly 210.

The thermal shield 236 is designed to shield the remainder of the light source assembly 210 from absorbing excessive energy from an external energy source 242 (illustrated as a circle), e.g., the sun, by either dissipating, reflecting or simply absorbing the energy. The design of the thermal shield 236 can be varied depending on the specific requirements of the light source assembly 210. In certain embodiments, as shown in FIG. 2A, the shield body 238 can have a lattice-type design that effectively inhibits and/or blocks at least a majority of the energy, e.g., the solar rays, from hitting a percentage of the housing assembly 212. Additionally, the holes that are provided in the lattice-type design allow for natural convection cooling of the top surface of the housing assembly 212. Alternatively, the thermal shield 236, i.e. the shield body 238, can have a different design than that illustrated in FIG. 2A.

Figure 2B:
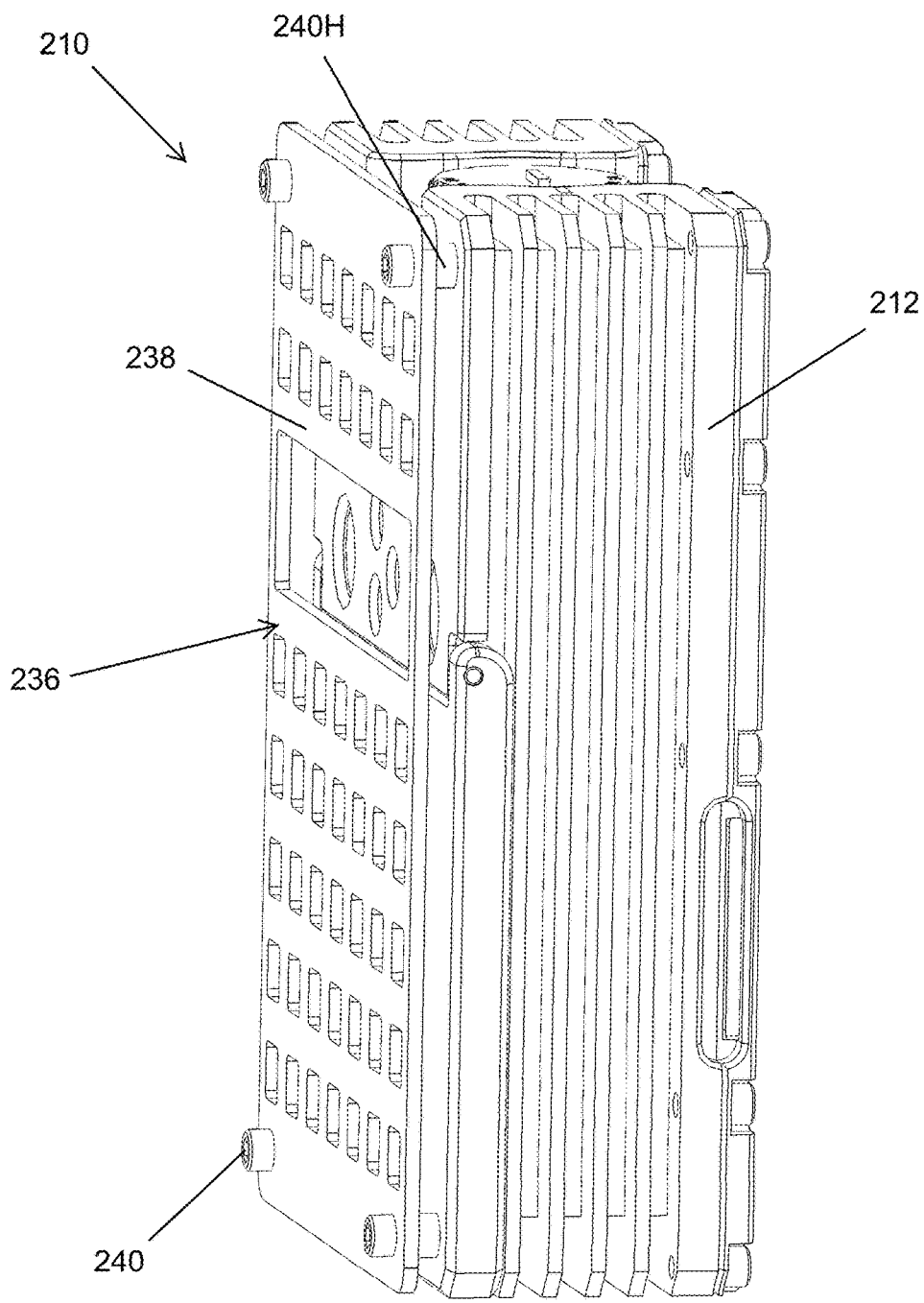
FIG. 2B is a simplified side perspective view of the light source assembly of FIG. 2A.

FIG. 2B is a simplified side perspective view of the light source assembly 210 of FIG. 2A. In particular, this side perspective view better illustrates how the shield body 238 of the thermal shield 236 can be coupled to and spaced apart from the housing assembly 212 of the light source assembly 210. For example, in some embodiments, each of the shield fasteners 240, e.g., screws, can extend within and/or through a fastener housing 240H that is positioned, at least in part, between the housing assembly 212 and the shield body 238. Thus, in such embodiments, the fastener housing 240H enables the shield body 238 to be maintained spaced apart from the housing assembly 212, while still enabling the fasteners to effectively couple the shield body 238 to the housing assembly 212.

Figure 2C:
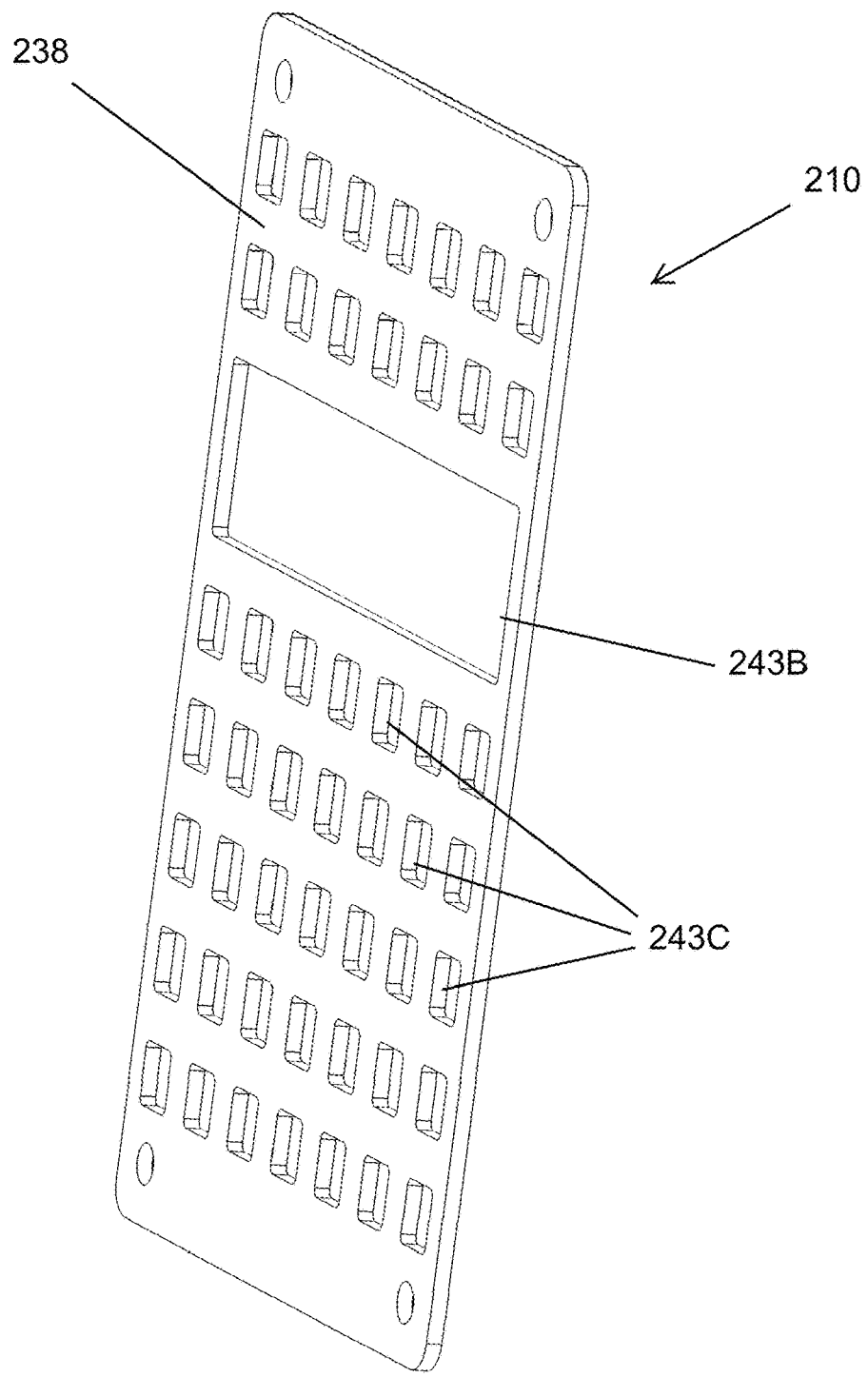
FIG. 2C is a front perspective view of a portion of the light source assembly of FIG. 2A.

FIG. 2C is a front perspective view of a portion of the light source assembly 210 of FIG. 2A. In particular, FIG. 2C illustrates a potential design for the shield body 238 that can be utilized to effectively inhibit and/or block a majority of the energy, e.g., the solar rays, from hitting the housing assembly 212 (illustrated in FIG. 2A), while still allowing for natural convection cooling of the top surface of the housing assembly 212. As shown, and as noted above, the shield body 238 can have a lattice-type design that enables such desirable features to be effectively accomplished.

In some embodiments, such as shown in FIG. 2C, the shield body 238 can include a plurality of cooling apertures 243C that can be sized and positioned to most effectively enable natural convection cooling of the full housing assembly 212. In certain non-exclusive alternative embodiments, the cooling apertures 243C can be substantially similar in size, can be evenly spaced apart from one another and can be sized to be positioned within between twenty percent and forty-five percent of the shield body 238. In one non-exclusive embodiment, the shield body 238 can include seven rows of cooling apertures 243C that each include seven individual cooling apertures 243C. Alternatively, the shield body 238 can include greater of fewer cooling apertures 243C than what is illustrated in FIG. 2C and/or the cooling apertures 243C can be positioned within greater than forty-five percent or less than twenty percent of the shield body 238.

Additionally, as shown, the shield body 238 can further include a beam aperture 243B that is positioned and sized to allow each of the output beams 26A-26E (illustrated in FIG. 1A) from each of the light sources 14A-14E (illustrated in FIG. 1A) to be directed away from the housing assembly 212 and through the beam aperture 243B. In one embodiment, as shown, the beam aperture 243B can be substantially rectangle-shaped. Alternatively, the beam aperture 243B can be another suitable shape.

Figure 3:
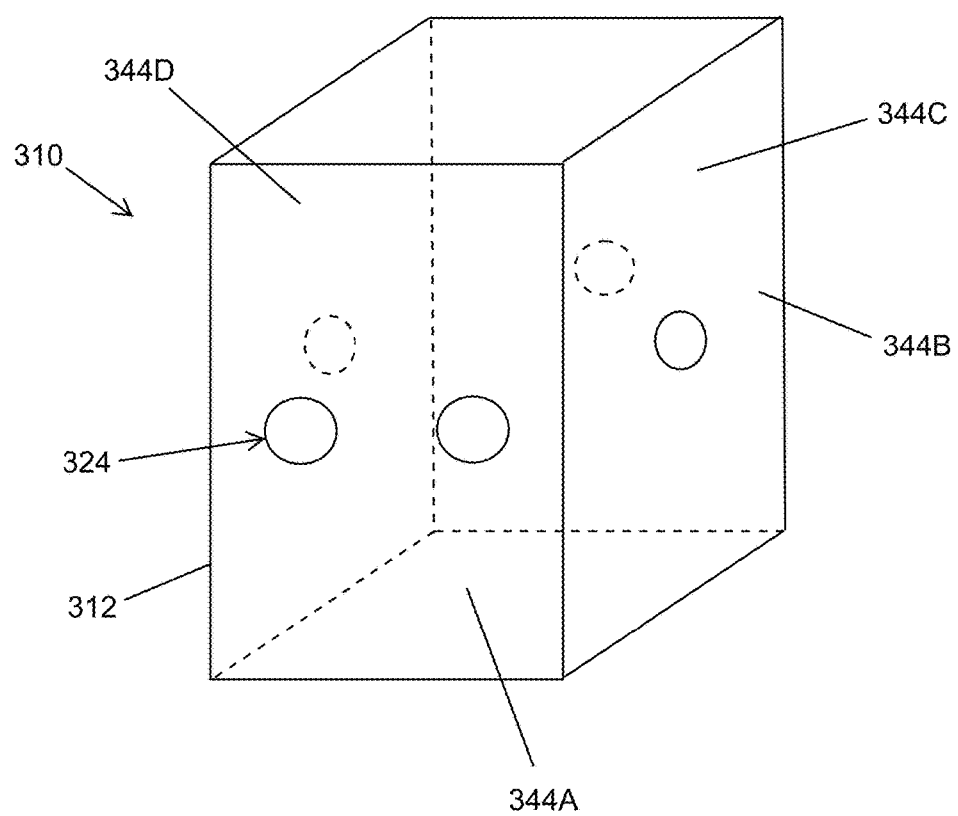
FIG. 3 is a simplified schematic front perspective view of a portion of still another embodiment of a light source assembly having features of the present invention.

FIG. 3 is a simplified schematic front perspective view of a portion of still another embodiment of a light source assembly 310 having features of the present invention. In particular, FIG. 3 provides a simplified front perspective view of another embodiment of the housing assembly 312, with the additional features of the light source assembly 310 having been omitted for purposes of clarity.

As noted above, in certain embodiments, the light source assembly 310 can be designed such that one or more of the output beams 26A-26E (illustrated in FIG. 1A) can be directed away from the housing assembly 312 at an angle relative to any of the other output beams 26A-26E, such that the output beams 26A-26E, and thus the beam axes 27A-27E (illustrated in FIG. 1A), are not parallel to one another. For example, in the non-exclusive alternative embodiment illustrated in FIG. 3, the housing assembly 312 can include a plurality of housing apertures 324, with one or more of the housing apertures 324 being potentially positioned along a front surface 344A, a first side surface 344B, a rear surface 344C and a second side surface 344D of the housing assembly 312. With this design, one or more of the output beams 26A-26E can be directed away from the housing assembly 312 through a different face of the housing assembly 312. For example, in one non-exclusive alternative arrangement, the first output beam 26A and the second output beam 26B can be directed away from the front surface 344A of the housing assembly 312, the third output beam 26C can be directed away from the first side surface 344B of the housing assembly 312, the fourth output beam 26D can be directed away from the rear surface 344C of the housing assembly 312, and the fifth output beam 26E can be directed away from the second side surface 344D of the housing assembly 312. Alternatively, the output beams 26A-26E can be directed away from the housing assembly 312 in a different manner. More specifically, it should be appreciated that in various alternative embodiments, each of the output beams 26A-26E can be directed away from the housing assembly 312 in any desired direction(s), away from any surface(s) 344A-344D of the housing assembly 12, and/or through any housing aperture(s) 324.

Figure 4A:
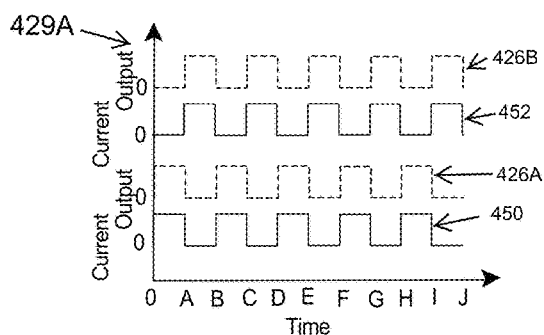
FIGS. 4A-4F are simplified graphical illustrations of current and output for various selector settings of the light source assembly of FIG. 1A.
Figure 4B:
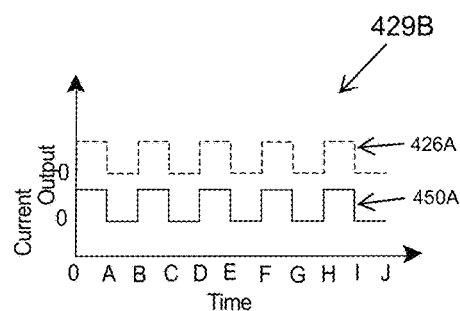
Figure 4C:
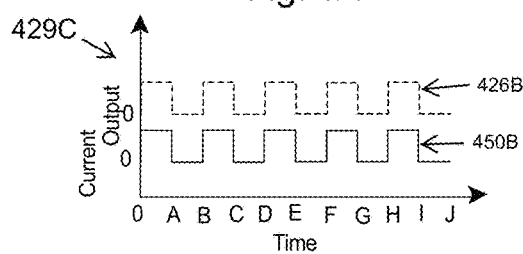
Figure 4D:
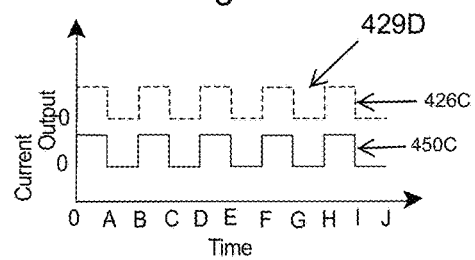
Figure 4E:
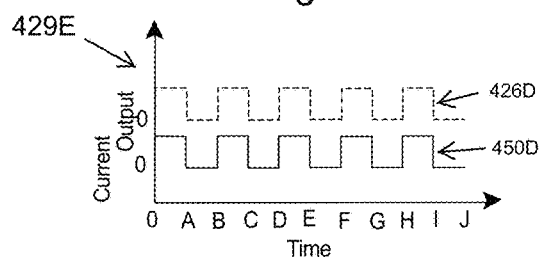
Figure 4F:
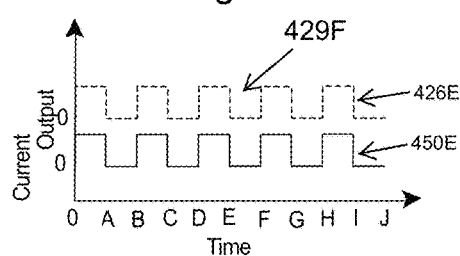

FIGS. 4A-4F are simplified graphical illustrations of current and output for various potential selector settings of the light source assembly of FIG. 1A. In particular, FIG. 4A is a simplified graphical illustration of current (illustrated with a solid line) and output (illustrated with a dashed line) for a first selector setting 429A wherein a first output beam 26A (illustrated in FIG. 1A) from a long-wavelength infrared light source 14A (illustrated in FIG. 1A) and a second output beam 26B (illustrated in FIG. 1A) from a mid-wavelength infrared light source 14B (illustrated in FIG. 1A) are generated in a pulsed and alternating manner; FIG. 4B is a simplified graphical illustration of current (illustrated with a solid line) and output (illustrated with a dashed line) for a second selector setting 429B wherein a first output beam 26A from a long-wavelength infrared light source 14A is generated in a pulsed manner; FIG. 4C is a simplified graphical illustration of current (illustrated with a solid line) and output (illustrated with a dashed line) for a third selector setting 429C wherein a second output beam 26B from a mid-wavelength infrared light source 14B is generated in a pulsed manner; FIG. 4D is a simplified graphical illustration of current (illustrated with a solid line) and output (illustrated with a dashed line) for a fourth selector setting 429D wherein a third output beam 26C (illustrated in FIG. 1A) from a short-wavelength infrared light source 14C is generated in a pulsed manner; FIG. 4E is a simplified graphical illustration of current (illustrated with a solid line) and output (illustrated with a dashed line) for a fifth selector setting 429E wherein a fourth output beam 26D (illustrated in FIG. 1A) from a near-infrared light source 14D (illustrated in FIG. 1A) is generated in a pulsed manner; and FIG. 4F is a simplified graphical illustration of current (illustrated with a solid line) and output (illustrated with a dashed line) for a sixth selector setting 429F wherein a fifth output beam 26E (illustrated in FIG. 1A) from a visible light source 14E (illustrated in FIG. 1A) is generated in a pulsed manner.

With reference to FIG. 4A, at the first selector setting 429A, the controller 18 (illustrated in FIG. 1D) can selectively direct current from the power source 20 (illustrated in FIG. 1E) to the first light source 14A (illustrated in FIG. 1A) in a first duty cycle 450 to generate the first output beam 426A, and direct current from the power source 20 to the second light source 14B (illustrated in FIG. 1A) in a second duty cycle 452 that is different from the first duty cycle to generate the second output beam 426B. In particular, in this embodiment, the first duty cycle 450 consists of current being directed to the first light source 14A for a first predetermined period of time and current not being directed to the first light source 14A for a second predetermined period of time, wherein the first predetermined period of time is approximately equal in length to the second predetermined period of time. Conversely, in this embodiment, the second duty cycle 452 consists of current not being directed to the second light source 14B for the first predetermined period of time and current being directed to the second light source 14B for the second predetermined period of time. With this non-exclusive example, each of the first duty cycle 450 and the second duty cycle 452 is approximately fifty percent, e.g., with current being directed and not directed to the given light source 14A, 14B for a substantially equal period of time. Moreover, with this mode of operation, the first output beam 426A and the second output beam 426B can be generated and/or emitted from the light source assembly 10 in an alternating manner. Alternatively, each of the first duty cycle 450 and the second duty cycle 452 can be greater than or less than approximately fifty percent.

It should be noted that with the first selector setting 429A, (i) the first light source 14A and the second light source 14B are on at different times (pulsed non-simultaneously); and (ii) the first output beam 426A and the second output beam 426B are non-simultaneous. Further, for the first selector setting 429A illustrated in FIG. 4A, the first light source 14A and the second light source 14B are pulsed in one for one alternating fashion, with a single pulse of the first output beam 426A being generated between two pulses of the second output beam 426B. In non-exclusive other embodiments, the duty cycles can be designed so that during certain periods of time, (i) multiple pulses of the first output beam 426A are being generated between two pulses of the second output beam 426B; and/or (ii) multiple pulses of the second output beam 426B are being generated between two pulses of the first output beam 426A. This feature allows for the generation of messages using the pulses of the output beams 426A, 426B.

Additionally, as shown in FIG. 4B, at the second selector setting 429B, the controller 18 (illustrated in FIG. 1D) can selectively direct current from the power source 20 (illustrated in FIG. 1E) to the first light source 14A (illustrated in FIG. 1A) in the first duty cycle 450A to generate the first output beam 26A. In the non-exclusive embodiment illustrated in FIG. 4B, the first duty cycle 450A is approximately fifty percent, e.g. the current is directed to the first light source 14A for a predetermined period of time and alternately the current is not directed to the first light source 14A for the same predetermined period of time. Alternatively, the first duty cycle 450A can be greater than or less than fifty percent.

Somewhat similarly, as shown in FIG. 4C, at the third selector setting 429C, the controller 18 (illustrated in FIG. 1D) can selectively direct current from the power source 20 (illustrated in FIG. 1E) to the second light source 14B (illustrated in FIG. 1A) in a second duty cycle 450B to generate the second output beam 426B. In the non-exclusive embodiment illustrated in FIG. 4C, the second duty cycle 450B is approximately fifty percent, e.g. the current is directed to the second light source 14B for a predetermined period of time and alternately the current is not directed to the second light source 14B for the same predetermined period of time. Alternatively, the second duty cycle 450B can be greater than or less than fifty percent.

Further, as shown in FIG. 4D, at the fourth selector setting 429D, the controller 18 (illustrated in FIG. 1D) can selectively direct current from the power source 20 (illustrated in FIG. 1E) to the third light source 14C (illustrated in FIG. 1A) in a third duty cycle 450C to generate the third output beam 426C. In the non-exclusive embodiment illustrated in FIG. 4D, the third duty cycle 450C is approximately fifty percent, e.g. the current is directed to the third light source 14C for a predetermined period of time and alternately the current is not directed to the third light source 14C for the same predetermined period of time. Alternatively, the third duty cycle 450C can be greater than or less than fifty percent.

Still further, as shown in FIG. 4E, at the fifth selector setting 429E, the controller 18 (illustrated in FIG. 1D) can selectively direct current from the power source 20 (illustrated in FIG. 1E) to the fourth light source 14D (illustrated in FIG. 1A) in a fourth duty cycle 450D to generate the fourth output beam 426D. In the non-exclusive embodiment illustrated in FIG. 4E, the fourth duty cycle 450D is approximately fifty percent, e.g. the current is directed to the fourth light source 14D for a predetermined period of time and alternately the current is not directed to the fourth light source 14D for the same predetermined period of time. Alternatively, the fourth duty cycle 450D can be greater than or less than fifty percent.

Yet further, as shown in FIG. 4F, at the sixth selector setting 429F, the controller 18 (illustrated in FIG. 1D) can selectively direct current from the power source 20 (illustrated in FIG. 1E) to the fifth light source 14E (illustrated in FIG. 1A) in a fifth duty cycle 450E to generate the fifth output beam 426E. In the non-exclusive embodiment illustrated in FIG. 4F, the fifth duty cycle 450E is approximately fifty percent, e.g. the current is directed to the fifth light source 14E for a predetermined period of time and alternately the current is not directed to the fifth light source 14E for the same predetermined period of time. Alternatively, the fifth duty cycle 450E can be greater than or less than fifty percent.

Figure 5:
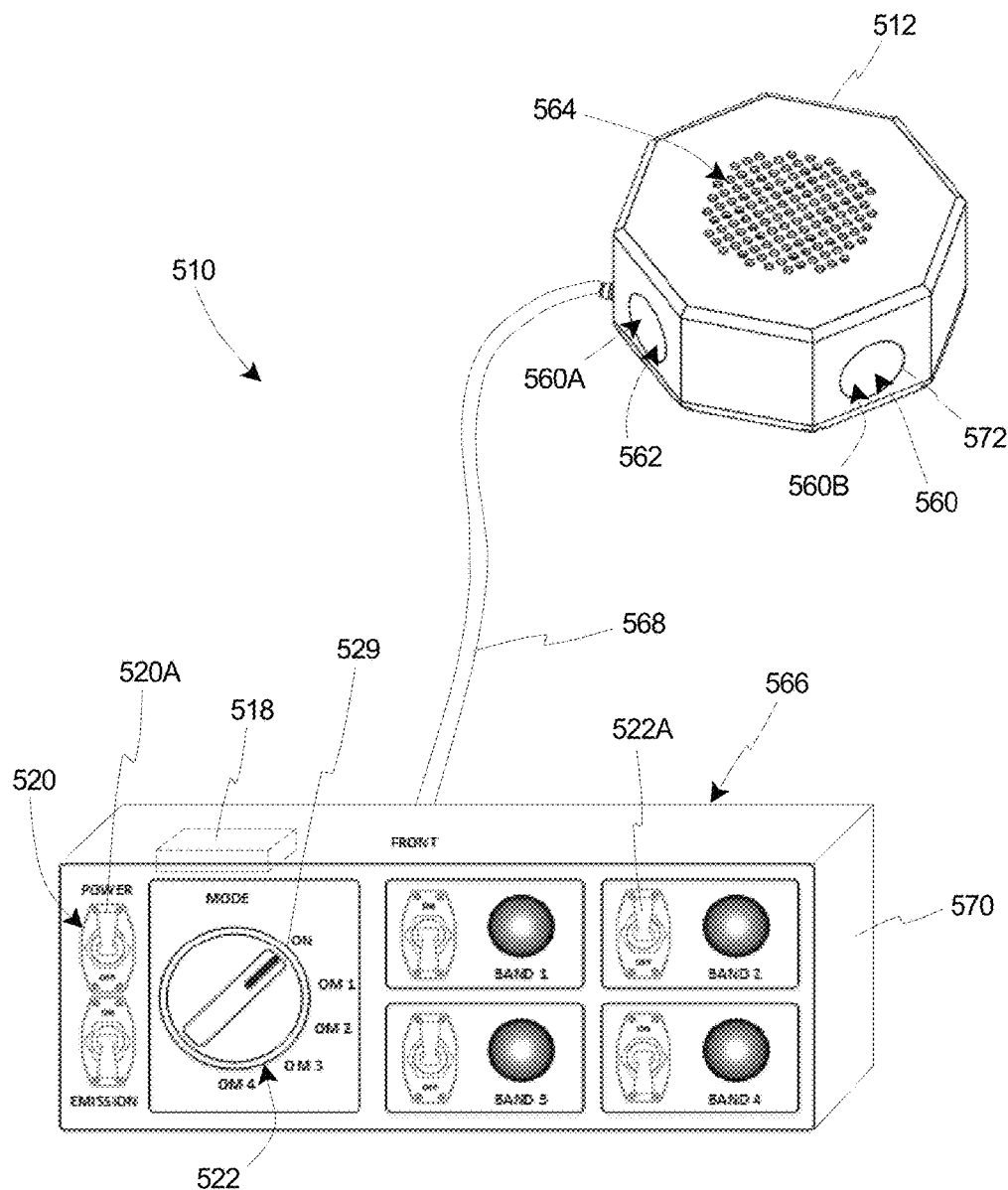
FIG. 5 is a simplified schematic perspective view illustration of another embodiment of the light source assembly.

FIG. 5 is a simplified schematic illustration of another embodiment of the light source assembly 510. The light source assembly 510 shown in FIG. 5 is somewhat similar to, i.e. has many components in common with, the embodiments of the light source assembly illustrated and described in detail herein above.

However, in this embodiment, the light source assembly 510 has a slightly different overall design and includes certain additional components than what was specifically shown in the previous embodiments. For example, as illustrated, the light source assembly 510 includes a housing assembly 512, and at least two sets of disparate light sources 560, at least two optical assemblies 562 and a temperature control assembly 564 that are coupled to, secured to and/or retained substantially within the housing assembly 512. Additionally, in this embodiment, the light source assembly 510 includes a control system 566 that is electrically connected to, e.g., with one or more wires 568, but is spaced apart from and positioned remotely from, the housing assembly 512 and the at least two sets of disparate light sources 560, the at least two optical assemblies 562 and the temperature control assembly 564 that are coupled to, secured to and/or retained substantially therein. Further, as shown, the control system 566 includes a controller 518 (illustrated in phantom), a power source 520 and a selector assembly 522 that are coupled to, secured to and/or retained substantially within a power/control housing 570. Stated in another manner, in this embodiment, the controller 518, the power source 520 and the selector assembly 522 are coupled to, secured to and/or retained substantially within the separate power/control housing 570, and are electrically connected to, but are spaced apart from and positioned remotely from, the housing assembly 512, and thus the at least two sets of disparate light sources 560, the at least two optical assemblies 562 and the temperature control assembly 564.

Figure 6A:
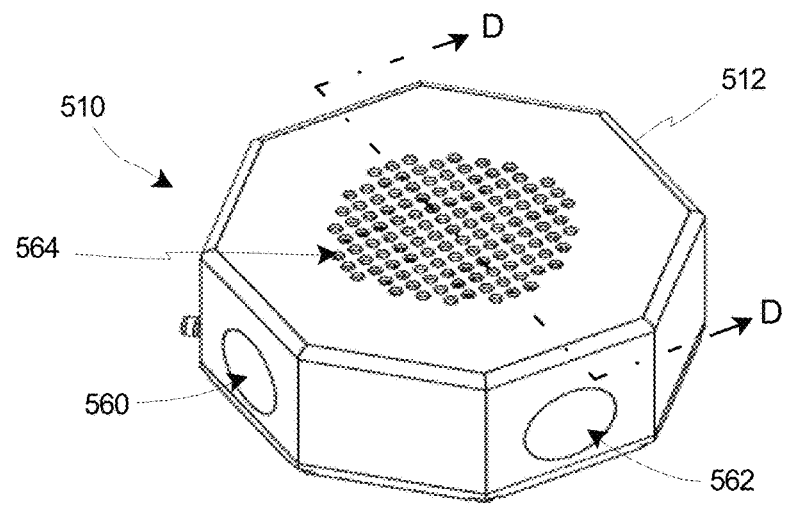
FIG. 6A is a simplified schematic perspective view illustration of a portion of the light source assembly illustrated in FIG. 5.
Figure 6B:
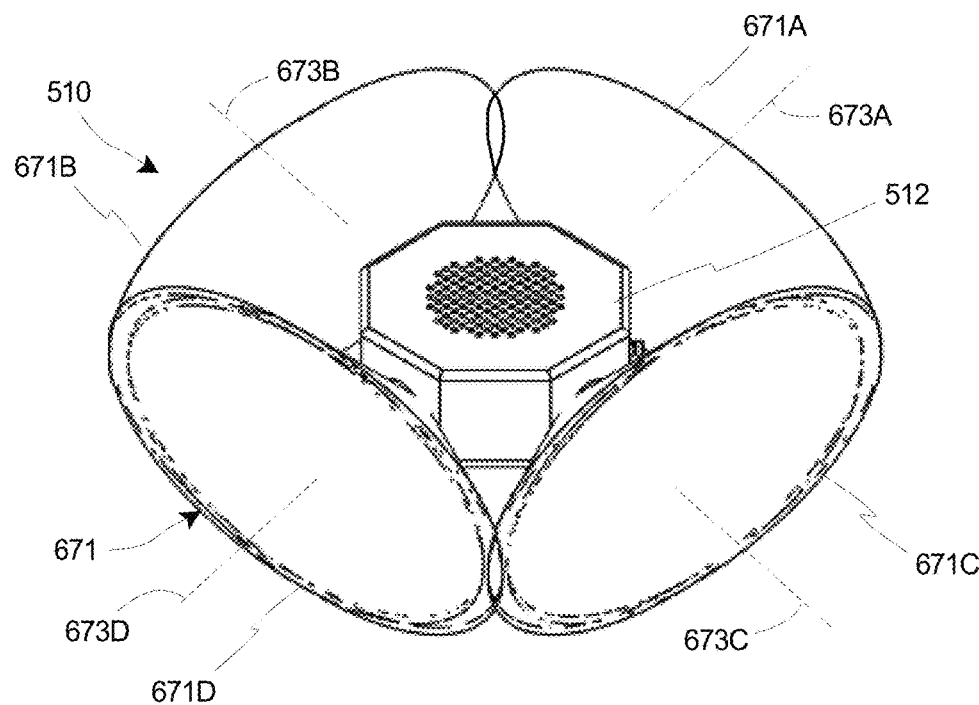
FIG. 6B is another simplified schematic perspective view illustration of the portion of the light source assembly illustrated in FIG. 6A.

As provided herein, in this embodiment, the light source assembly 510 can include any suitable number of sets of disparate light sources 560 that are each configured to generate output (light) beams 671 (illustrated in FIG. 6B) that are directed in a different general axial direction, i.e. along and about a different central beam axis 673 (illustrated in FIG. 6B). For example, in one embodiment, the light source assembly 510 can be configured to include four sets of disparate light sources 560, i.e. a first plurality of disparate light sources 560A, a second plurality of disparate light sources 560B, a third plurality of disparate light sources 560C (illustrated in FIG. 6C), and a fourth plurality of disparate light sources 560D (illustrated in FIG. 6C), that are each configured to generate output (light) beams 671 that are directed in a different general axial direction. More particularly, in this embodiment, the first plurality of disparate light sources 560A is configured to generate first output (light) beams 671A (illustrated in FIG. 6B) that are directed in a first general axial direction along and about a first central beam axis 673A (illustrated in FIG. 6B); the second plurality of disparate light sources 560B is configured to generate second output (light) beams 671B (illustrated in FIG. 6B) that are directed in a second general axial direction along and about a second central beam axis 673B (illustrated in FIG. 6B) that is different than the first general axial direction; the third plurality of disparate light sources 560C is configured to generate third output (light) beams 671C (illustrated in FIG. 6B) that are directed in a third general axial direction along and about a third central beam axis 673C (illustrated in FIG. 6B) that is different than the first general axial direction and the second general axial direction; and the fourth plurality of disparate light sources 560D is configured to generate fourth output (light) beams 671D (illustrated in FIG. 6B) that are directed in a fourth general axial direction along and about a fourth central beam axis 673D that is different than the first general axial direction, the second general axial direction and the third general axial direction.

As discussed in greater detail herein below, with such design, it is possible that the light source assembly 510 can generate output (light) beams 671A-671D that provide substantially 360-degree azimuthal coverage about and/or relative to the housing assembly 512. Stated in another manner, in such embodiments, the output beams 671 can be detectable in any and all azimuthal directions relative to the housing assembly 512. Alternatively, in other embodiments, the light source assembly 510 can be configured to include greater than four or less than four sets of disparate light sources 560. Still alternatively, the light source assembly 510 can generate output beams 671 that provide less than 360-degree azimuthal coverage about and/or relative to the housing assembly 512. Yet alternatively, the light source assembly 510 can be configured such that only a single output light beam from a single light source is directed in any given direction away from the housing assembly 512.

The housing assembly 512 can be any suitable size and shape for purposes of providing a housing for the sets of disparate light sources 560, the optical assemblies 562 and the temperature control assembly 564. For example, as shown in the embodiment illustrated in FIG. 5, the housing assembly 512 can be substantially octagonal disk-shaped. Alternatively, the housing assembly 512 can be substantially rectangular box-shaped, square box-shaped, cylindrical disk-shaped, hexagonal disk-shaped, pyramid-shaped, or another suitable shape.

Additionally, as shown, the housing assembly 512 can include a plurality of housing apertures 572 that are spaced apart from one another about a perimeter of the housing assembly 512. For example, in this embodiment, a housing aperture 572 can extend through every other side of the substantially octagonal disk-shaped housing assembly 512. The housing apertures 572 provide a means through which the output beams 671 that are generated by the sets of disparate light sources 560 can be directed out of and away from the housing assembly 512.

In this embodiment, the housing assembly 512 includes a single housing aperture 572 for each plurality of disparate light sources 560. More particularly, in this embodiment, the housing assembly 512 includes four housing apertures 572, with one housing aperture 572 being positioned substantially adjacent to each of the sets of disparate light sources 560, i.e. a first housing aperture 572 is positioned substantially adjacent to the first plurality of disparate light sources 560A, a second housing aperture 572 is positioned substantially adjacent to the second plurality of disparate light sources 560B, a third housing aperture 572 is positioned substantially adjacent to the third plurality of disparate light sources 560C, and a fourth housing aperture 572 is positioned substantially adjacent to the fourth plurality of disparate light sources 560D. As above, each housing aperture 572 can be aligned to allow for the emitting and directing of the corresponding plurality of disparate light sources 560 out of and/or away from the housing assembly 512 and away from the light source assembly 510, such that the individual light sources can be quickly, easily and accurately detected by the detector assembly 23 (illustrated in FIG. 1A).

With such design, the general axial direction that the output beams 671 are directed for each of the sets of disparate light sources 560 can be substantially evenly spaced apart about the housing assembly 512. Stated in another manner, in such embodiments, the central beam axes 673A-673D can be substantially evenly spaced apart from one another. More particularly, in this embodiment that includes four housing apertures 572 and four sets of disparate light sources 560, the general axial direction that the output beams 671 are directed for each of the sets of disparate light sources 560 can be approximately ninety degrees from the general axial direction of the output beams 671 of adjacent sets of disparate light sources 560. Alternatively, in an embodiment that includes six sets of disparate light sources 560, the general axial direction that the output beams 671 are directed for each of the sets of disparate light sources 560 can be approximately sixty degrees from the general axial direction of the output beams 671 of adjacent sets of disparate light sources 560. Still alternatively, in an embodiment that includes three sets of disparate light sources 560, the general axial direction that the output beams 671 are directed for each of the sets of disparate light sources 560 can be approximately one hundred twenty degrees from the general axial direction of the output beams 671 of adjacent sets of disparate light sources 560.

It is appreciated that in different embodiments and applications, the sets of disparate light sources 560 need not be evenly spaced apart from one another, not each of the sets of disparate light sources 560 need to be activated or operational at any given time, and the sets of disparate light sources 560 need not provide approximately 360-degree azimuthal coverage about and/or relative to the housing assembly 512. For example, in certain non-exclusive alternative embodiments, one or more of the sets of disparate light sources 560 can be activated or operated at any given time so as to provide at least approximately 180-degree, 210-degree, 240-degree, 270-degree, 300-degree, 330-degree or 360-degree azimuthal coverage about and/or relative to the housing assembly 512. Additionally, in other non-exclusive alternative embodiments, the central beam axes 673A-673D can be oriented and/or spaced apart at least approximately forty-five degrees, sixty degrees, seventy-five degrees, ninety degrees, one hundred five degrees, or one hundred twenty degrees from any adjacent central beam axes 673A-673D.

The number, type, design, positioning and orientation of the disparate light sources within each plurality of disparate light sources 560 can be varied depending on the specific requirements of the light source assembly 510. Additionally, as with the previous embodiments, each of the individual light sources within each plurality of disparate light sources 560 can be designed and/or individually tuned to provide an output beam 671 having a specific wavelength. Further, similar to above-described embodiments, each of the individual light sources can generate and/or emit an independent output beam.

Figure 6C:
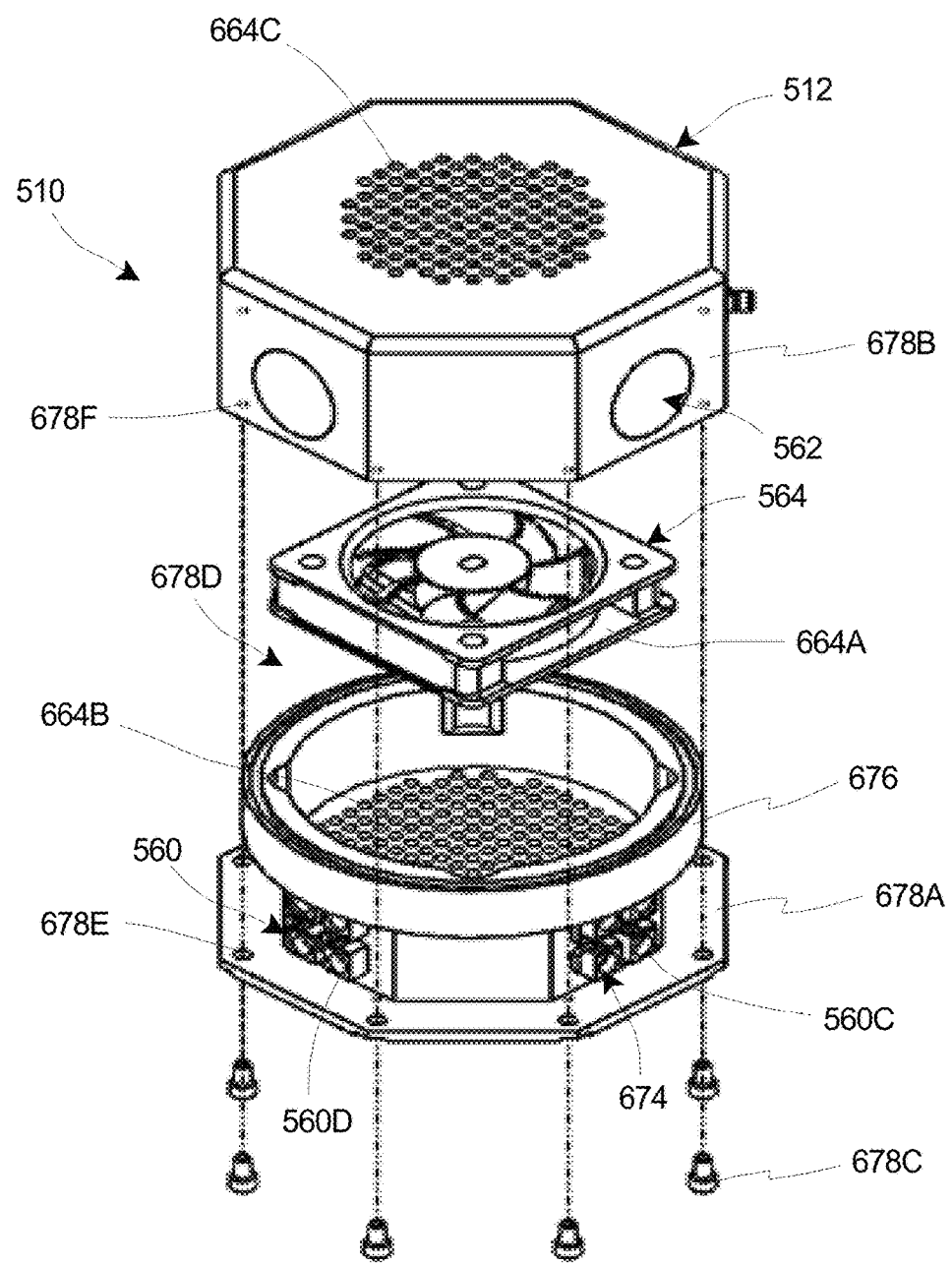
FIG. 6C is an exploded view illustration of the portion of the light source assembly illustrated in FIG. 6A.
Figure 6D:
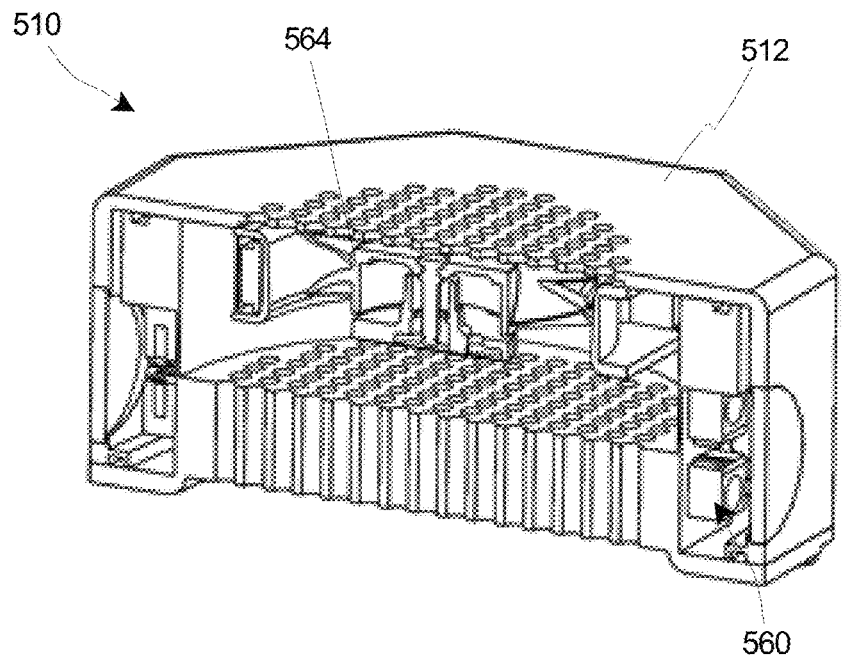
FIG. 6D is a cutaway view of the portion of the light source assembly taken on line D-D in FIG. 6A.
Figure 6E:
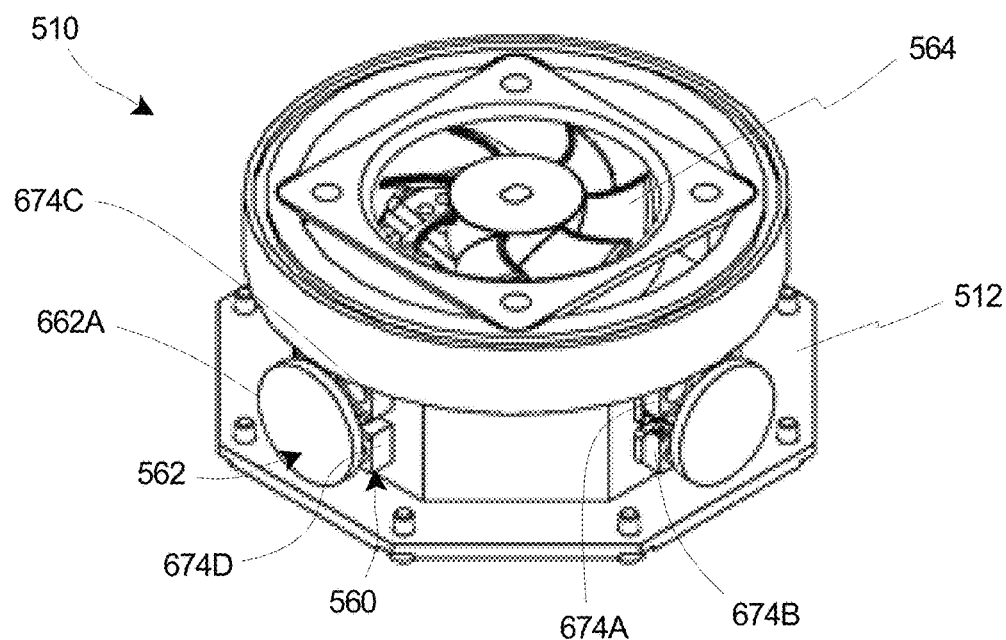
FIG. 6E is a simplified schematic perspective view illustration of another portion of the light source assembly illustrated in FIG. 5.

Jumping ahead briefly to FIG. 6E, FIG. 6E is a simplified schematic perspective view illustration of a portion of the light source assembly 510 illustrated in FIG. 5. In particular, FIG. 6E shows the housing assembly 512 and the at least two sets of disparate light sources 560, the at least two optical assemblies 562 and the temperature control assembly 564 that are coupled to, secured to and/or retained substantially therein, but with certain portions of the housing assembly 512 having been removed for purposes of clarity. More specifically, FIG. 6E illustrates certain additional features and aspects of the sets of disparate light sources 560.

In certain embodiments, each of the sets of disparate light sources 560 can include the same number of disparate light sources 674. For example, as shown in FIG. 6E, each of the sets of disparate light sources 560 can include four disparate light sources 674, i.e. a first light source 674A, a second light source 674B, a third light source 674C, and a fourth light source 674D. Alternatively, each of the sets of disparate light sources 560 can include greater than four or fewer than four disparate light sources 674. Still alternatively, each of the sets of disparate light sources 560 can include a different number of disparate light sources 674.

Additionally, each of the disparate light sources 674 can be designed and/or individually tuned to provide an output beam 671 (illustrated in FIG. 6B) having a specific wavelength. Moreover, each of the sets of disparate light sources 560 can include individual disparate light sources 674 that are designed and/or individually tuned to provide an output beam 671 having the same specific wavelength. Stated in another manner, in such embodiments, each of the sets of disparate light sources 560 can include (i) the first light source 674A that generates and/or emits a first output beam 671 having a first center wavelength; (ii) the second light source 674B that generates and/or emits a second output beam 671 having a second center wavelength that is different than the first center wavelength; (iii) the third light source 674C that generates and/or emits a third output beam 671 having a third center wavelength that is different than the first center wavelength and the second center wavelength; and (iv) the fourth light source 674D that generates and/or emits a fourth output beam 671 having a fourth center wavelength that is different than the first center wavelength, the second center wavelength and the third center wavelength. In some embodiments, each of the output beams 671 within each of the sets of disparate light sources 560 can be spaced apart from and substantially parallel to each of the other output beams 671 within that plurality of disparate light sources 560. Alternatively, in other embodiments, one or more of the output beams 671 within each of the sets of disparate light sources 560 can be directed away from the housing assembly 512 at an angle relative to any of the other output beams 671 within that plurality of disparate light sources 560, such that the output beams 671 are not parallel to one another.

Further, as above, in various embodiments, each of the output beams 671 can be viewable with the detector assembly 23 (illustrated in FIG. 1A). Stated in another manner, during use, the detector assembly 23 can selectively detect each of the output beams 671 that are generated and/or emitted by each of the light sources 674A-674D within each of the sets of disparate light sources 560.

Returning now to FIG. 5, in certain embodiments, the light source assembly 510 can include a separate optical assembly 562 that corresponds with each of the sets of disparate light sources 560. As above, the optical assemblies 562 can be provided to enable any desired focusing, shaping and directing of the output beams 671 from each individual light source 674A-674D (illustrated in FIG. 6E) within each of the sets of disparate light sources 560. For example, in certain embodiments, each optical assembly 562 can include one or more optical elements 662A (illustrated in FIG. 6E), e.g., one or more lenses, mirrors, diffractive optical elements and/or other optical elements, to enable any desired focusing, shaping and directing of the output beams 671 from each individual light source 674A-674D within each of the sets of disparate light sources 560. Additionally and/or alternatively, one or more optical elements 662A of each optical assembly 562 can include a window designed such that the output beams 671 are not collimated, i.e. are uncollimated. Still alternatively, one or more of the output beams 671 can be directed away from the housing assembly 512 without the need for any optical elements.

Jumping ahead again to FIG. 6E, in some embodiments, the optical assembly 562 that corresponds to each of the sets of disparate light sources 560 can include a single optical element 662A, e.g., a single lens, mirror, diffractive optical element, window and/or other optical element, to enable any desired focusing, shaping and directing of the output beams 671 from each of the sets of disparate light sources 560. Stated in another manner, in such embodiments, each of the individual light sources 674A-674D within each of the sets of disparate light sources 560 can generate output beams 671 that are directed toward and/or through a single lens, mirror, diffractive optical element, window and/or other optical element. Alternatively, the optical assembly 562 that corresponds to each of the sets of disparate light sources 560 can include more than one lens, mirror, diffractive optical element, window and/or other optical element to enable any desired focusing, shaping and directing of the output beams 671 from each of the sets of disparate light sources 560. For example, in one non-exclusive alternative embodiment, the optical assembly 562 that corresponds to each of the sets of disparate light sources 560 can include one or more lenses, mirrors, diffractive optical elements, windows and/or other optical elements for each individual light source 674A-674D within the respective plurality of disparate light sources 560.

Returning once again back to FIG. 5, the temperature control assembly 564 is configured to control the heat that can be generated through the use of the light source assembly 510. More specifically, in various embodiments, the temperature control assembly 564 is configured to help dissipate any heat generated during use of the light source assembly 510, and/or to inhibit any such heat generated during use of the light source assembly 510 from adversely impacting any operations of the light source assembly 510. Particular features and aspects that may be included within the temperature control assembly 564 will be described in greater detail herein below.

The control system 566 enables the necessary and desired control of the operation of the light source assembly 510. More specifically, in various embodiments, the controller 518 enables the necessary and desired control of the operation of the light source assembly 510, i.e. the selective operation of one or more of the individual light sources 674A-674D of each of the sets of disparate light sources 560, by selectively controlling the electrical power that is provided by the power source 520 to the light sources 674A-674D. In certain applications, the controller 518 selectively directs current from the power source 520 to one or more of the light sources 674A-674D based on the particular selections made by the operator via the selector assembly 522. Additionally, as above, each of the individual light sources 674A-674D of each of the sets of disparate light sources 560 can be operated in a pulsed mode of operation (and with any desired duty cycle) or in a continuous wave mode of operation.

The design of the controller 518 can be varied. In some embodiments, the controller 518 can include one or more processors and circuits that are electrically connected to the selector assembly 522. With this design, the processors control the selective operation of each of the individual light sources 674A-674D in each of the sets of disparate light sources 560 based on selections made by the operator via the selector assembly 522. Additionally, as noted above, in certain embodiments, the controller 18 can direct power to one or more of the light sources 674A-674D in a pulsed fashion to minimize heat generation in, and power consumption by the light sources 674A-674D, while still achieving the desired average optical power of the output beams. This enables more efficient use of the power source 520 as well as helping to minimize the heat generated. As a result thereof, this increases the number of operational environments in which the light source assembly 510 can be used.

The power source 520 is coupled to, secured to, and/or positioned substantially within the power/control housing 570. Additionally, the power source 520 is electrically connected to the controller 518, the selector assembly 522, the individual light sources 674A-674D of each of the sets of disparate light sources 560, and the temperature control assembly 564. In various embodiments, the power source 520 provides the necessary and desired electrical power to effectively and efficiently operate the light source assembly 510, e.g., to selectively activate and control one or more of the individual light sources 674A-674D of each of the sets of disparate light sources 560. In one non-exclusive alternative embodiment, the power source 520 can include a generator that is external to the power/control housing 570, but is electrically coupled to the power/control housing 570 and the components coupled to, secured to, and/or positioned substantially therein. It is understood that any generator that may be used as part of the power source 520 can be of any suitable size. For example, the generator can be used solely as part of the light source assembly 510 or the generator can be used to operate one or more other systems and devices in addition to its use with the light source assembly 510. For example, when the light source assembly 510 is utilized with or on a vehicle, the generator can be utilized to power various systems and devices within the vehicle. Alternatively, in another non-exclusive embodiment, the power source 520 can include one or more batteries that can be, but need not be, retained substantially within the power/control housing 570. Still alternatively, in still another non-exclusive embodiment, the power source 520 can include a generator that is internal to the power/control housing 570. Additionally, as shown, in any embodiments of the power source 520, the power source 520 can be selectively activated and/or regulated through use of a power switch 520A.

The selector assembly 522 is electrically connected to the controller 518. For example, in some embodiments, the selector assembly 522 can include one or more switches and/or one or more dials that are each electrically connected to the controller 518. In certain embodiments, the selector assembly 522 enables the user to selectively choose between a variety of potential modes of operation via a plurality of selector settings 529. The potential modes of operation and/or the specific selector settings 529 can be varied to suit the specific design requirements of the light source assembly 510. It should be appreciated that the potential modes of operation and/or selector settings 529 can include a combined and/or alternating use of any single or any combination of the individual light sources 674A-674D of each of the sets of disparate light sources 560. Additionally, as shown, the selector assembly 522 can include a separate switch 522A for each of the individual light sources 674A-674D (i.e. each band) of each of the sets of disparate light sources 560. Further, in certain embodiments, the selector assembly 522 can be adjusted by the user to enable the selective adjustment of a pulse rate and/or duty cycle of the emission of the output beams 671 when the output beams 671 are generated and/or emitted in a pulsed mode of operation, and/or to enable one or more of the output beams 671 to be generated and/or emitted in a continuous wave mode of operation. Additionally, as noted above, it should be appreciated that utilizing a pulsed mode of operation can assist the light source assembly 510 in achieving more efficient and/or lower overall power usage by the power source 520, and can further inhibit the undesired generation of heat within the light source assembly 510.

FIG. 6A is a simplified schematic perspective view illustration of a portion of the light source assembly 510 illustrated in FIG. 5. More particularly, FIG. 6A is a simplified schematic perspective view illustration of the housing assembly 512 and the at least two sets of disparate light sources 560, the at least two optical assemblies 562, and the temperature control assembly 564 that are coupled to, secured to and/or retained substantially therein.

FIG. 6B is another simplified schematic perspective view illustration of the portion of the light source assembly 510 illustrated in FIG. 6A. In particular, FIG. 6B is a simplified schematic perspective view illustration that shows output beams 671 that have been emitted within each of the sets of disparate light sources 560 (illustrated in FIG. 5) and that are being directed away from the housing assembly 512 through one of the housing apertures 572 (illustrated more clearly in FIG. 5). More specifically, FIG. 6B illustrates (i) first output beams 671A that have been emitted from the first plurality of disparate light sources 560A (illustrated in FIG. 5); (ii) second output beams 671B that have been emitted from the second plurality of disparate light sources 560B (illustrated in FIG. 5); (iii) third output beams 671C that have been emitted from the third plurality of disparate light sources 560C (illustrated in FIG. 6C); and (iv) fourth output beams 671D that have been emitted from the fourth plurality of disparate light sources 560D (illustrated in FIG. 6C). As illustrated, and as noted above, the output beams 671A-671D from each of the sets of disparate light sources 560 can at least slightly overlap one another such that the light source assembly 510 is able to provide substantially 360-degree azimuthal coverage about and/or relative to the housing assembly 512. With such design, the detector assembly 23 (illustrated in FIG. 1A) is able to effectively capture and/or detect the signal from the light source assembly 510 regardless of the orientation of the light source assembly 510, i.e. of the housing assembly 512, relative to the detector assembly 23, provided that the detector assembly 23 is close enough and is pointing generally toward the light source assembly 510. Alternatively, as noted above, the output beams 671A-671D from each of the sets of disparate light sources 560 can be configured to provide less than approximately 360-degree azimuthal coverage about and/or relative to the housing assembly 512.

It is appreciated that the output beams 671A-671D that are generated and/or emitted from each of the sets of disparate light sources 560 can include any single individual light source 674A-674D or any combination of the individual light sources 674A-674B from each of the sets of disparate light sources 560. Additionally, as noted above, it is also appreciated that the output beams 671A-671D can be generated and/or emitted from each of the sets of disparate light sources 560 in a pulsed mode of operation and/or in a continuous wave mode of operation.

FIG. 6C is an exploded view illustration of the portion of the light source assembly 510 illustrated in FIG. 6A. As shown, FIG. 6C illustrates certain specific features and aspects of the housing assembly 512 and the temperature control assembly 564. Additionally, FIG. 6C also illustrates a seal housing assembly 676 that can be included as part of the light source assembly 510.

As illustrated in this embodiment, the housing assembly 512 can include a housing base 678A and a housing cover 678B that is secured to the housing base 678A with a plurality of housing attachers 678C. Additionally, the housing base 678A and the housing cover 678B can cooperate to create a housing cavity 678D within which are positioned the sets of disparate light sources 560, the optical assemblies 562, the seal housing assembly 676, and at least a portion of the temperature control assembly 564.

In certain embodiments, as shown, the housing base 678A can be substantially flat, octagonal plate-shaped. Additionally, the housing base 678A can include a plurality of base apertures 678E that are sized and shaped for receiving the plurality of housing attachers 678C. In one such embodiment, one base aperture 678E can be positioned near each corner of the housing base 678A. Alternatively, the housing base 678A can have another suitable shape.

Additionally, in this embodiment, the housing cover 678B is provided in the form of an octagonal-shaped box top, with a size and shape that corresponds with the overall size and shape of the housing base 678A. Further, the housing cover 678B can include a plurality of cover apertures 678F that are sized and shaped for receiving the plurality of housing attachers 678C. In one such embodiment, one cover aperture 678F can be positioned near each corner of the housing cover 678B. Alternatively, the housing cover 678B can have another suitable design, e.g., can have another suitable shape.

The plurality of housing attachers 678C can have any suitable design for purposes of securing the housing cover 678B to the housing base 678A. For example, in some embodiments, the plurality of housing attachers 678C can be provided in the form of screws or pins that extend into and/or through the plurality of base apertures 678E and the plurality of cover apertures 678F. More specifically, each of the plurality of base attachers 678C can extend into and/or through one of the base apertures 678E and one of the cover apertures 678F. Alternatively, the housing base 678A and the housing cover 678B can be secured to one another in another suitable manner.

As noted above, the temperature control assembly 564 is configured to help dissipate any heat generated during use of the light source assembly 510, and/or to inhibit any such heat generated during use of the light source assembly 510 from adversely impacting any operations of the light source assembly 510. The temperature control assembly 564 can have any suitable design and can include any suitable components. For example, in various embodiments, as shown in FIG. 6C, the temperature control assembly 564 can include a fan 664A, heat spreaders 664B (or heat sink), and one or more vents 664C. Alternatively, the temperature control assembly 564 can have a different design, i.e. can have more components, fewer components or simply different components than what is shown in FIG. 6C.

As shown, the fan 664A can be positioned at least substantially within the housing assembly 512. The fan 664A can be selectively operated to help move heat away from the sets of disparate light sources 560 and/or to provide cooling air to the sets of disparate light sources 560. In some applications, the operator of the light source assembly 510 can choose when to activate the fan 664A. Additionally and/or alternatively, the light source assembly 510 can be designed such that the fan 664A is automatically activated whenever the light source assembly 510 is in use or when the temperature inside the housing assembly 512 reaches a certain threshold value.

The heat spreaders 664B help to spread and/or transfer heat from the light source assembly 510, i.e. to effectively move heat away from the sets of disparate light sources 560. More particularly, in one non-exclusive alternative embodiment, the heat spreaders 664B can comprise a plurality of fins that provide greater surface area for the housing assembly 512 as a means to more effectively transfer heat away from the sets of disparate light sources 560 and/or other components of the light source assembly 510 and into the surrounding environment. In one embodiment, the heat spreaders 664B can be integrally formed with the housing assembly 512. More specifically, in such embodiment, the heat spreaders 664B can be integrally formed as part of the housing base 678A. Alternatively, the heat spreaders 664B can be formed independently of the housing assembly 512 and can be subsequently coupled to the housing assembly 512. Still alternatively, the heat spreaders 664B can have a different design than that shown in FIG. 6C.

In this embodiment, the one or more vents 664C can provide a passive means to allow heat to escape from within the housing cavity 678D. In particular, in the embodiment shown in FIG. 6C, the one or more vents 664C can be provided in the form of a plurality of holes that are formed in the housing cover 678B. As heat is generated during the use of the light source assembly 510, the heat will tend to rise and flow through the plurality of holes, i.e. the vent 664C, formed in the housing cover 678B. Alternatively, the one or more vents 664C can have another suitable design and/or can be formed in a different part of the housing assembly 512.

The seal housing assembly 676 is configured to provide a sealed environment about the individual light sources 674A-674D and each of the sets of disparate light sources 560. In certain embodiments, as shown, the seal housing assembly 676 can be substantially annular-shaped and can be positioned to substantially encircle the individual light sources 674A-674D and each of the sets of disparate light sources 560. With such design, the light sources 674A-674D and the sets of disparate light sources 560 can be better protected from environmental conditions, e.g., conditions found in a maritime environment. For example, the seal housing assembly 676 can inhibit corrosion of the individual light sources 674A-674D and each of the sets of disparate light sources 560, which may otherwise adversely impact the operation of the light source assembly 510 in some environments, e.g., in maritime environments.

FIG. 6D is a cutaway view of the portion of the light source assembly 510 taken on line D-D in FIG. 6A. More specifically, FIG. 6D illustrates more details about the design of the housing assembly 512, and the design and positioning of the at least two sets of disparate light sources 560 and the temperature control assembly 564 that are coupled to, secured to and/or retained substantially within the housing assembly 512.

FIG. 6E is a simplified schematic perspective view illustration of another portion of the light source assembly 510 illustrated in FIG. 5. In particular, FIG. 6E again shows the housing assembly 512 and the at least two sets of disparate light sources 560, the at least two optical assemblies 562 and the temperature control assembly 564 that are coupled to, secured to and/or retained substantially therein, but with certain portions of the housing assembly 512, i.e. the housing cover 678B, having been removed for purposes of clarity. Additionally, as noted above, FIG. 6E also illustrates an embodiment of the individual light sources 674A-674D that can be included as part of each of the sets of disparate light sources 560.

Figure 7A:
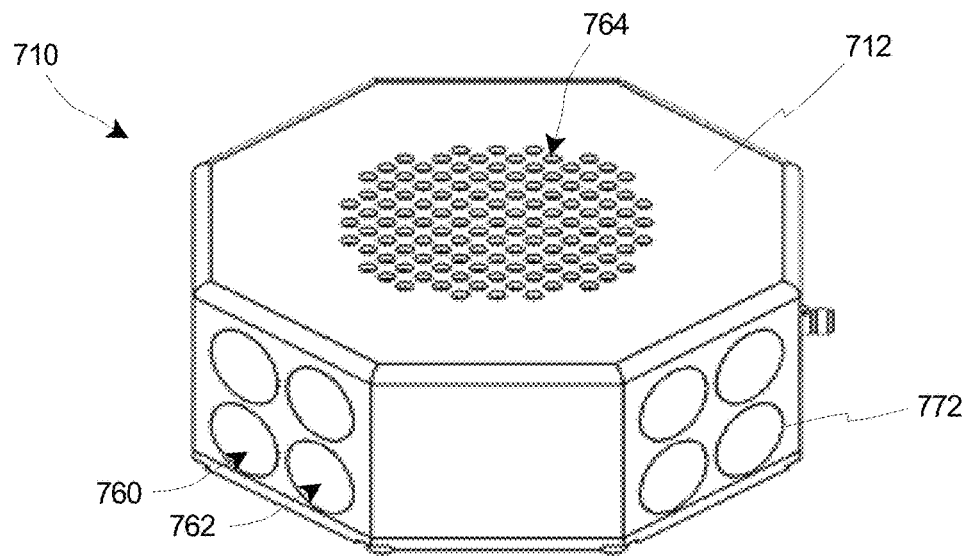
FIG. 7A is a simplified schematic perspective view illustration of a portion of another embodiment of the light source assembly.

FIG. 7A is a simplified schematic perspective view illustration of a portion of another embodiment of the light source assembly 710. The light source assembly 710 is substantially similar to the light source assembly 510 illustrated and described above in relation to FIGS. 5 and 6A-6E. For example, the light source assembly 710 again includes a housing assembly 712, and at least two sets of disparate light source 760, at least two optical assemblies 762 and a temperature control assembly 764 that are somewhat similar to what was illustrated and described in relation to FIGS. 5 and 6A-6E.

However, in this embodiment, the housing assembly 712 and each of the optical assemblies 762 are slightly different than in the preceding embodiment. More particularly, in this embodiment, the housing assembly 712 includes a separate housing aperture 772 for the output beams 771 (illustrated in FIG. 7B) generated and/or emitted from each of the individual light sources 674 (illustrated in FIG. 6E) for each of the sets of disparate light sources 760. Additionally, each individual light source 674 of each of the sets of disparate light sources 760 includes an individual optical assembly 762. Stated in another manner, each individual light source 674 of each of the sets of disparate light sources 760 includes one or more lenses, mirrors, diffractive optical elements, windows, etc. for any desired focusing, shaping and directing of the output beams 771 from each of the sets of disparate light sources 760.

Figure 7B:
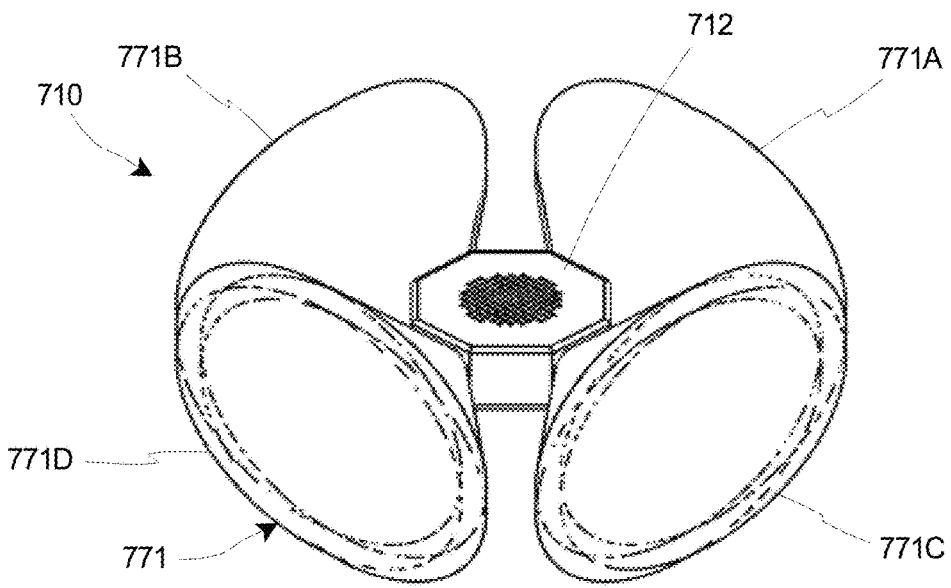
FIG. 7B is another simplified schematic perspective view illustration of the portion of the light source assembly illustrated in FIG. 7A.

FIG. 7B is another simplified schematic perspective view illustration of the portion of the light source assembly 710 illustrated in FIG. 7A. In particular, FIG. 7B is a simplified schematic perspective view illustration that shows output beams 771 that have been emitted within each of the sets of disparate light sources 760 (illustrated in FIG. 7A) and that are being directed away from the housing assembly 712 through the housing apertures 772 (illustrated in FIG. 7A). More specifically, FIG. 7B illustrates (i) first output beams 771A that have been emitted from the first plurality of disparate light sources 760; (ii) second output beams 771B that have been emitted from the second plurality of disparate light sources 760; (iii) third output beams 771C that have been emitted from the third plurality of disparate light sources 760; and (iv) fourth output beams 771D that have been emitted from the fourth plurality of disparate light sources 760. As with the previous embodiment, the output beams 771A-771B can be positioned and oriented to provide at least nearly 360-degree coverage about and/or relative to the housing assembly 712. With such design, the detector assembly 23 (illustrated in FIG. 1A) is able to effectively capture and/or detect the signal from the light source assembly 710 regardless of the orientation of the light source assembly 710, i.e. of the housing assembly 712, relative to the detector assembly 23, provided that the detector assembly 23 is close enough and is pointing generally toward the light source assembly 710. Alternatively, as noted above, the output beams 771A-771D from each of the sets of disparate light sources 760 can be configured to provide less than approximately 360-degree azimuthal coverage about and/or relative to the housing assembly 712.

Figure 8:
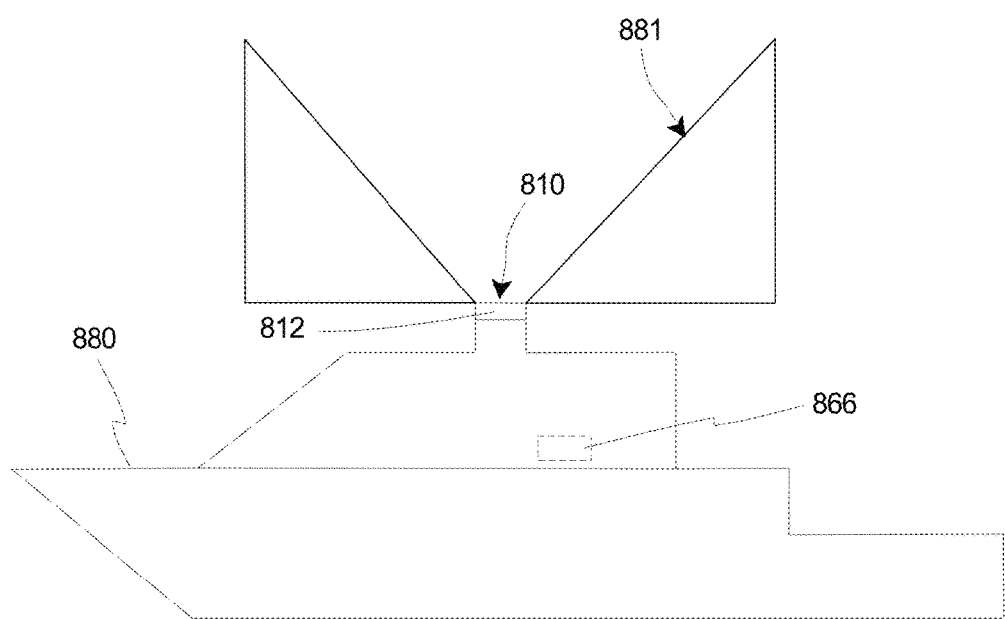
FIG. 8 is a simplified schematic illustration of a maritime vehicle with the light source assembly mounted thereon.

FIG. 8 is a simplified schematic illustration of a maritime vehicle 880 with a light source assembly 810, e.g., the light source assembly 510 illustrated in FIG. 5 or the light source assembly 710 illustrated in FIG. 7A, mounted thereon. In particular, FIG. 8 illustrates the control system 866 (illustrated in phantom) being positioned inside the maritime vehicle 880, and the remainder of the light source assembly 810, i.e. the housing assembly 812 and all of the components retained substantially therein, mounted to an elevated external portion of the maritime vehicle 880. With such design and positioning of the light source assembly 810, the output beams 881 from the light source assembly 810 can be easily detected by a detector assembly 23 (illustrated in FIG. 1A) regardless of the orientation of the light source assembly 810, i.e. of the housing assembly 812, relative to the detector assembly 23, provided that the detector assembly 23 is close enough and is pointing generally toward the light source assembly 810.

It is understood that although a number of different embodiments of a light source assembly have been illustrated and described herein, one or more features of any one embodiment can be combined with one or more features of one or more of the other embodiments, provided that such combination satisfies the intent of the present invention.

While a number of exemplary aspects and embodiments of a light source assembly have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A light source assembly for use by a user, the light source assembly comprising:
   a housing assembly;
   a first set of disparate light sources that is coupled to the housing assembly; and
   a second set of disparate light sources that is coupled to the housing assembly;
   wherein each of the sets of disparate light sources includes a first light source that is configured to generate a first light beam having a first center wavelength and a second light source that is configured to generate a second light beam having a second center wavelength that is different than the first center wavelength;
   wherein the first set of disparate light sources generates at least one first output beam that is directed away from the housing assembly along and about a first central beam axis; and
   wherein the second set of disparate light sources generates at least one second output beam that is directed away from the housing assembly along and about a second central beam axis; wherein the first central beam axis is angularly spaced apart from the second central beam axis by at least approximately sixty degrees.

2. The light source assembly of claim 1 wherein the at least one first output beam includes a first, first light beam; wherein the at least one second output beam includes a second, first light beam; and wherein the first central beam axis is spaced apart from the second central beam axis by at least approximately sixty degrees.

3. The light source assembly of claim 1 wherein the first central beam axis is spaced apart from the second central beam axis by at least approximately ninety degrees.

4. The light source assembly of claim 1 wherein the at least two sets of disparate light sources further includes a third plurality of disparate light sources; wherein the third plurality of disparate light sources generates at least one third output beam that is directed away from the housing assembly along and about a third central beam axis; and wherein the third central beam axis is spaced apart from each of the first central beam axis and the second central beam axis by at least approximately sixty degrees.

5. The light source assembly of claim 1 further comprising a temperature control assembly that is coupled to the housing assembly, the temperature control assembly being configured to dissipate heat that is generated during use of the light source assembly.

6. The light source assembly of claim 1 further comprising a seal housing assembly that is configured to provide a sealed environment about the at least two sets of disparate light sources.

7. The light source assembly of claim 1 further comprising a control system that is electrically coupled, but is positioned remotely from the at least two sets of disparate light sources; the control system including a controller that selectively controls electrical power from a power source that is provided to each of the at least two sets of disparate light sources.

8. The light source assembly of claim 7 wherein the control system further includes a selector assembly that is electrically connected to the controller, the selector assembly being selectively controllable by the user to select a mode of operation for the at least two sets of disparate light sources.

9. The light source assembly of claim 1 wherein the housing assembly includes a first housing aperture, and a second housing aperture that is spaced apart from the first housing aperture; and wherein the at least one first output beam is directed away from the housing assembly through the first housing aperture, and the at least one second output beam is directed away from the housing assembly through the second housing aperture.

10. A light source assembly for use by a user, the light source assembly comprising:
a housing assembly; and
at least two sets of disparate light sources that are coupled to the housing assembly, the at least two sets of disparate light sources including (i) a first plurality of disparate light sources; (ii) a second plurality of disparate light sources; (iii) a third plurality of disparate light sources; and (iv) a fourth plurality of disparate light sources;
wherein each of the sets of disparate light sources includes a first light source that is configured to generate a first light beam having a first center wavelength and a second light source that is configured to generate a second light beam having a second center wavelength that is different than the first center wavelength;
wherein the first plurality of disparate light sources generates at least one first output beam that is directed away from the housing assembly along and about a first central beam axis;
wherein the second plurality of disparate light sources generates at least one second output beam that is directed away from the housing assembly along and about a second central beam axis;
wherein the third plurality of disparate light sources generates at least one third output beam that is directed away from the housing assembly along and about a third central beam axis; and wherein the third central beam axis is spaced apart from each of the first central beam axis and the second central beam axis by at least approximately sixty degrees; and
wherein the fourth plurality of disparate light sources generates at least one fourth output beam that is directed away from the housing assembly along and about a fourth central beam axis; and wherein the fourth central beam axis is spaced apart from each of the first central beam axis, the second central beam axis and the third central beam axis by at least approximately sixty degrees.

11. The light source assembly of claim 10 wherein each of the central beam axes are spaced apart from each of the other central beam axes by approximately ninety degrees.

12. The light source assembly of claim 10 wherein the at least one first output beam, the at least one second output beam, the at least one third output beam, and the at least one fourth output beam provide approximately 360-degree azimuthal coverage about the housing assembly.

13. A light source assembly for use by a user, the light source assembly comprising:
a housing assembly; and
at least two sets of disparate light sources that are coupled to the housing assembly, the at least two sets of disparate light sources including (i) a first plurality of disparate light sources; and (ii) a second plurality of disparate light sources;
wherein each of the sets of disparate light sources includes a first light source that is configured to generate a first light beam having a first center wavelength and a second light source that is configured to generate a second light beam having a second center wavelength that is different than the first center wavelength;
wherein the first plurality of disparate light sources generates at least one first output beam that is directed away from the housing assembly along and about a first central beam axis;
wherein the second plurality of disparate light sources generates at least one second output beam that is directed away from the housing assembly along and about a second central beam axis; and
wherein the at least one first output beam and the at least one second output beam provide at least approximately 180-degree azimuthal coverage about the housing assembly.

14. The light source assembly of claim 13 wherein the at least one first output beam includes a first, first light beam; and wherein the at least one second output beam includes a second, first light beam.

15. The light source assembly of claim 13 wherein the at least two sets of disparate light sources further includes a third plurality of disparate light sources; wherein the third plurality of disparate light sources generates at least one third output beam that is directed away from the housing assembly along and about a third central beam axis; and wherein the at least one first output beam, the at least one second output beam and the at least one third output beam provide at least approximately 270-degree azimuthal coverage about the housing assembly.

16. The light source assembly of claim 15 wherein the at least two sets of disparate light sources further includes a fourth plurality of disparate light sources; wherein the fourth plurality of disparate light sources generates at least one fourth output beam that is directed away from the housing assembly along and about a fourth central beam axis; and wherein the at least one first output beam, the at least one second output beam, the at least one third output beam, and the at least one fourth output beam provide approximately 360-degree azimuthal coverage about the housing assembly.

17. The light source assembly of claim 13 wherein each of the central beam axes are spaced apart from each of the other central beam axes by at least approximately ninety degrees.

18. The light source assembly of claim 13 further comprising a temperature control assembly that is coupled to the housing assembly, the temperature control assembly being configured to dissipate heat that is generated during use of the light source assembly.

19. The light source assembly of claim 13 further comprising a seal housing assembly that is configured to provide a sealed environment about the at least two sets of disparate light sources.

20. The light source assembly of claim 13 further comprising a control system that is electrically coupled, but is positioned remotely from the at least two sets of disparate light sources; the control system including a controller that selectively controls electrical power from a power source that is provided to each of the at least two sets of disparate light sources.

21. The light source assembly of claim 20 wherein the control system further includes a selector assembly that is electrically connected to the controller, the selector assembly being selectively controllable by the user to select a mode of operation for the at least two sets of disparate light sources.

22. The light source assembly of claim 13 wherein the housing assembly includes a first housing aperture, and a second housing aperture that is spaced apart from the first housing aperture; and wherein the at least one first output beam is directed away from the housing assembly through the first housing aperture, and the at least one second output beam is directed away from the housing assembly through the second housing aperture.

* * * * *